United States Patent [19]

Hasegawa

[11] Patent Number: 5,043,571
[45] Date of Patent: Aug. 27, 1991

[54] CCD PHOTOSENSOR AND ITS APPLICATION TO A SPECTROPHOTOMETER

[75] Inventor: Jun Hasegawa, Osaka, Japan

[73] Assignee: Minolta Camera Kabushiki Kaisha, Osaka, Japan

[21] Appl. No.: 387,213

[22] Filed: Jul. 28, 1989

[30] Foreign Application Priority Data

Aug. 1, 1988 [JP] Japan ................................ 63-192466
Aug. 1, 1988 [JP] Japan ................................ 63-192467
Sep. 29, 1988 [JP] Japan ................................ 63-245132
Jul. 24, 1989 [JP] Japan ................................ 1-191085

[51] Int. Cl.⁵ .................................................. G01J 3/50
[52] U.S. Cl. ................................ 250/226; 250/203.3; 356/320
[58] Field of Search ............... 250/208.2, 208.3, 226; 356/320, 323, 324, 325, 222

[56] References Cited

U.S. PATENT DOCUMENTS

| | | | |
|---|---|---|---|
| 4,174,528 | 11/1979 | White | 358/213 |
| 4,263,512 | 4/1981 | Sagusa et al. | 356/320 |
| 4,389,661 | 7/1983 | Yamada | 357/24 |
| 4,435,897 | 3/1984 | Kuroda et al. | 357/24 |
| 4,544,271 | 10/1985 | Yamamoto | 356/320 |
| 4,687,329 | 8/1987 | Schultz | 250/226 |
| 4,800,591 | 1/1989 | Sato | 382/50 |

FOREIGN PATENT DOCUMENTS 58-47375 3/1983 Japan.
61-201577 3/1985 Japan.
60-220966 11/1985 Japan.
62-44818 9/1987 Japan.

*Primary Examiner*—David C. Nelms
*Attorney, Agent, or Firm*—Joseph W. Price

[57] ABSTRACT

A spectrophotometer is composed of a spectrofilter, a plurality of bandpass filters for cutting unnecessary transmission bands, and a CCD photosensor. The photosensor is composed of two sets of photosensors having different sensitivity ranges that overlap at some portion to increase the dynamic range of the device. The handling amount of charges is increased at every portion of the CCD photosensor in order to reduce the influence of the shot noise. Further, various technologies are used to enhance the accuracy and stability of the spectrophoto-measurement.

9 Claims, 26 Drawing Sheets

FIG. 1
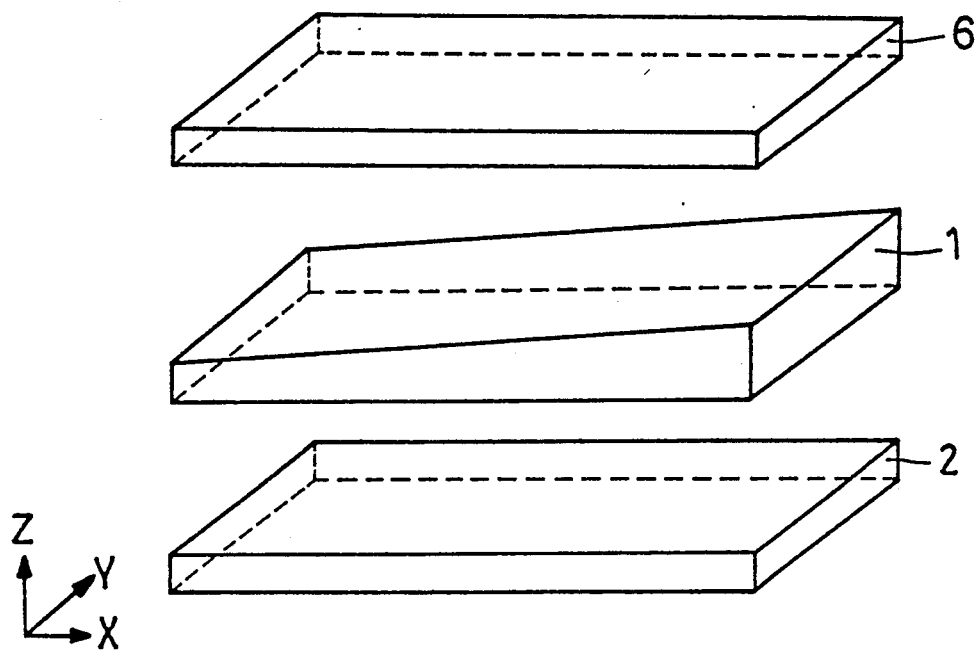
FIG. 2
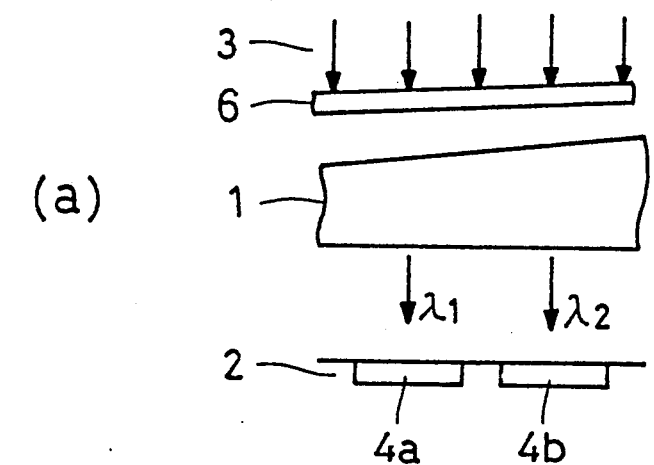
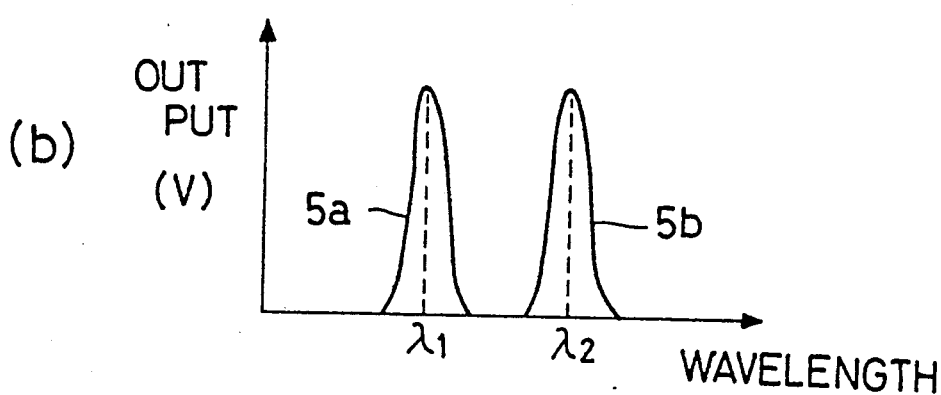

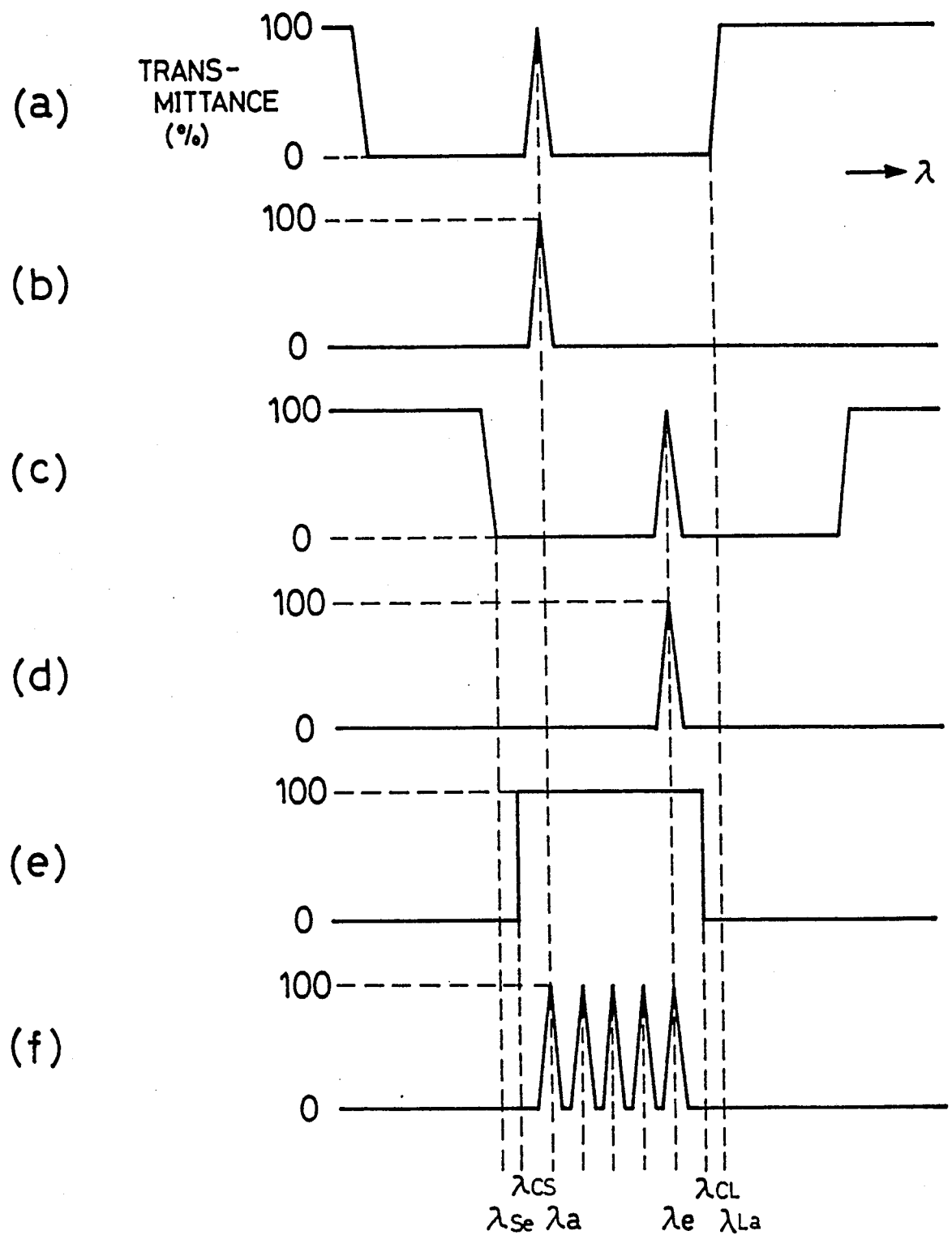

FIG. 10
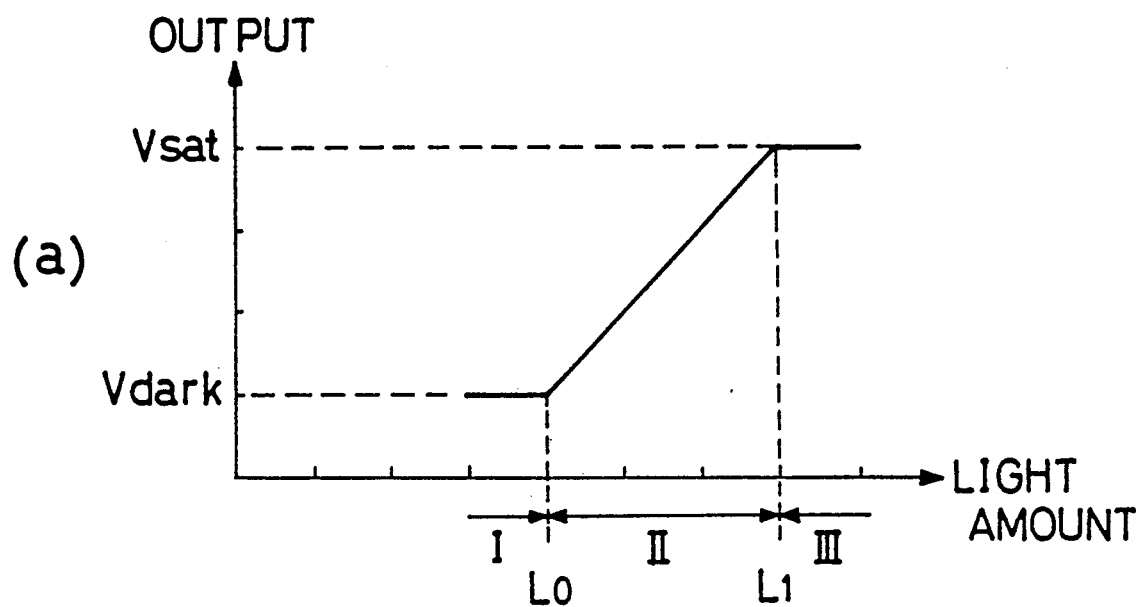
(a)
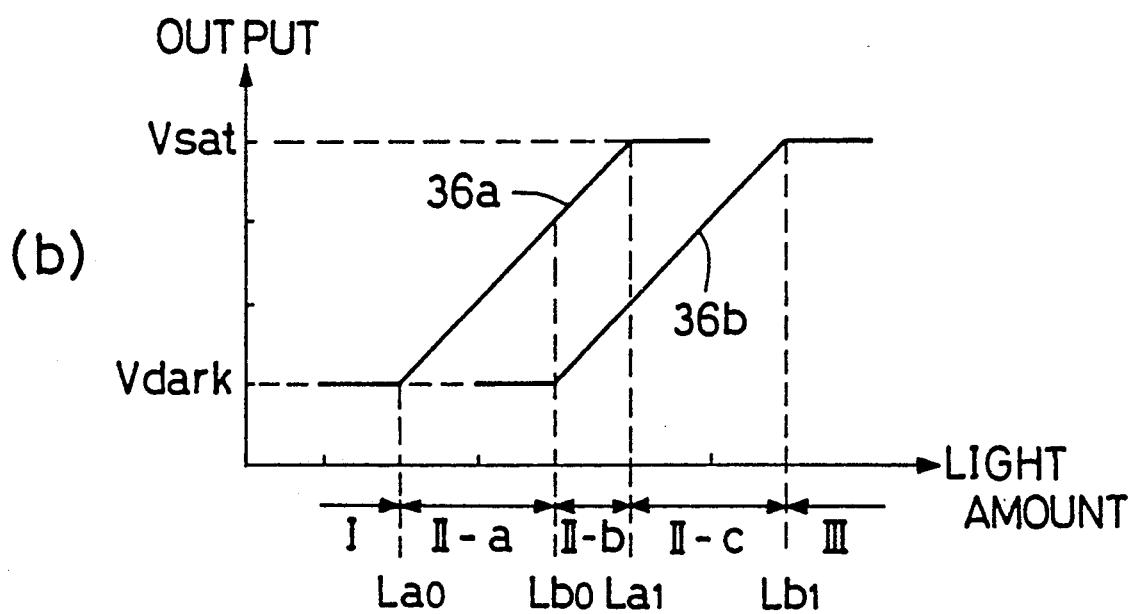
(b)

FIG. 12
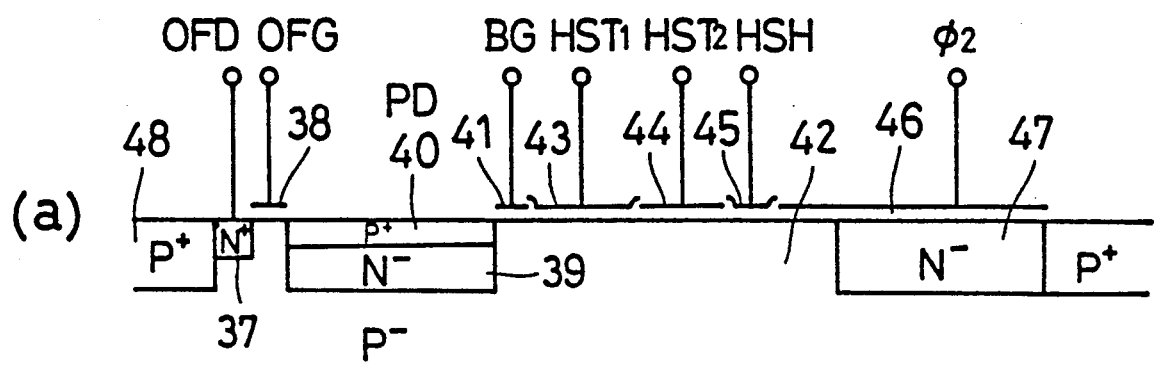
(a)
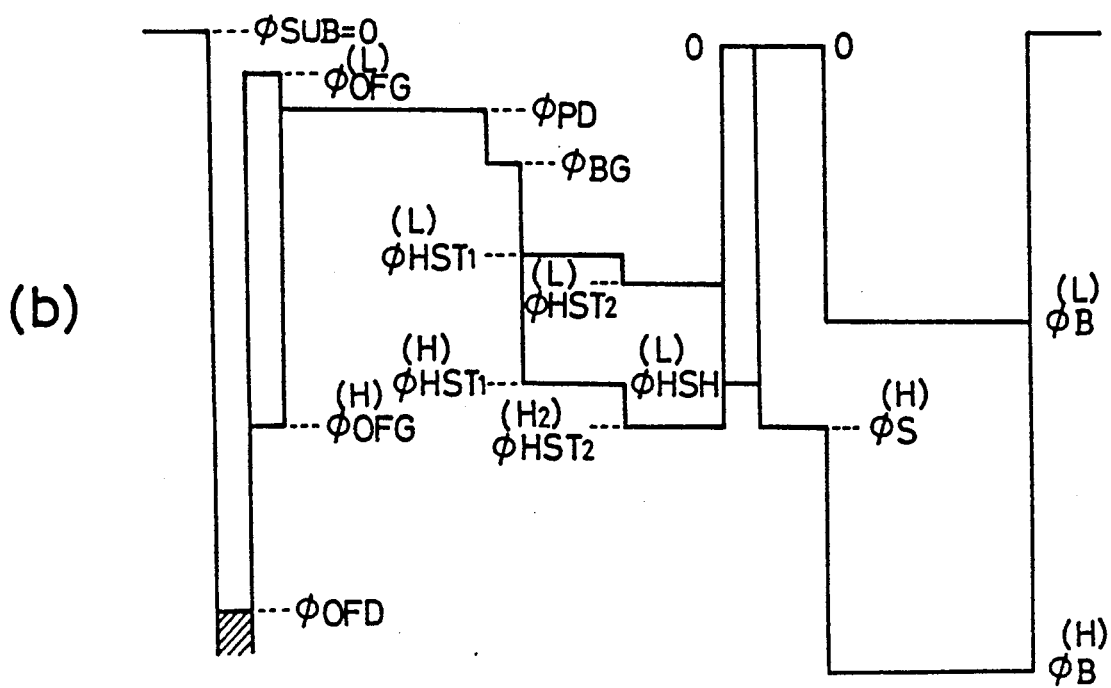
(b)

FIG. 13
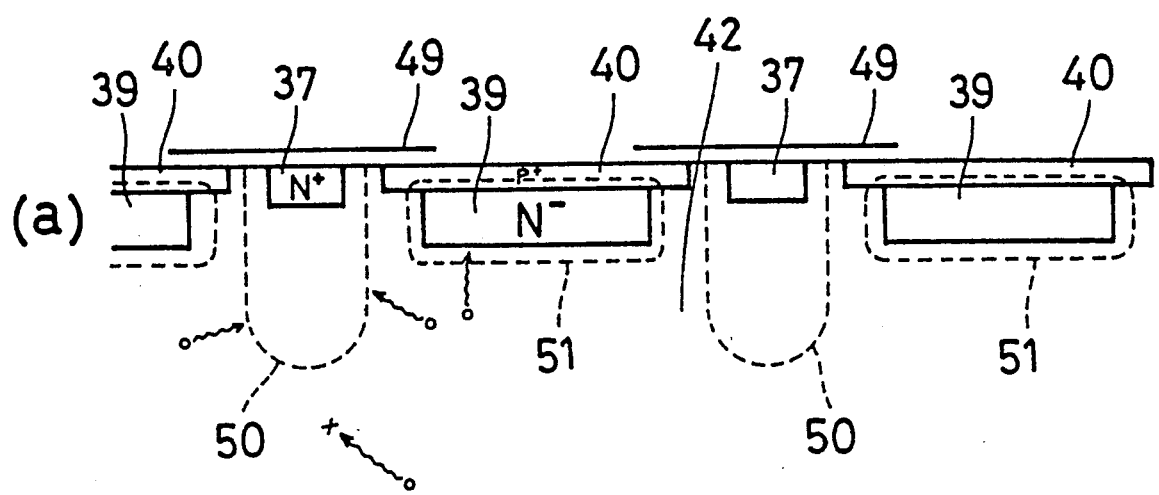
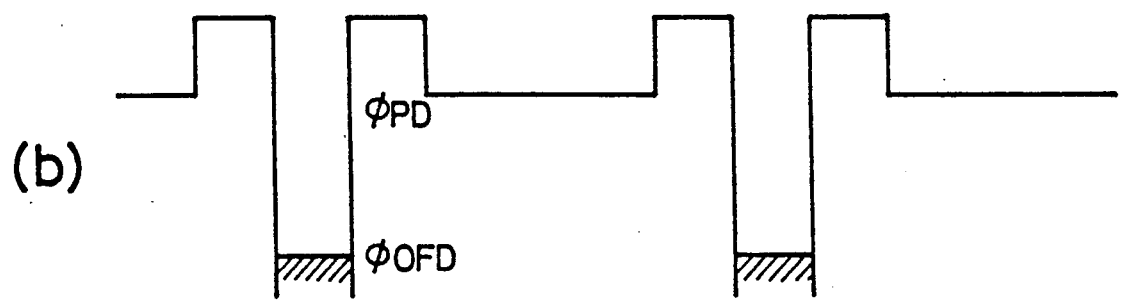

FIG. 16
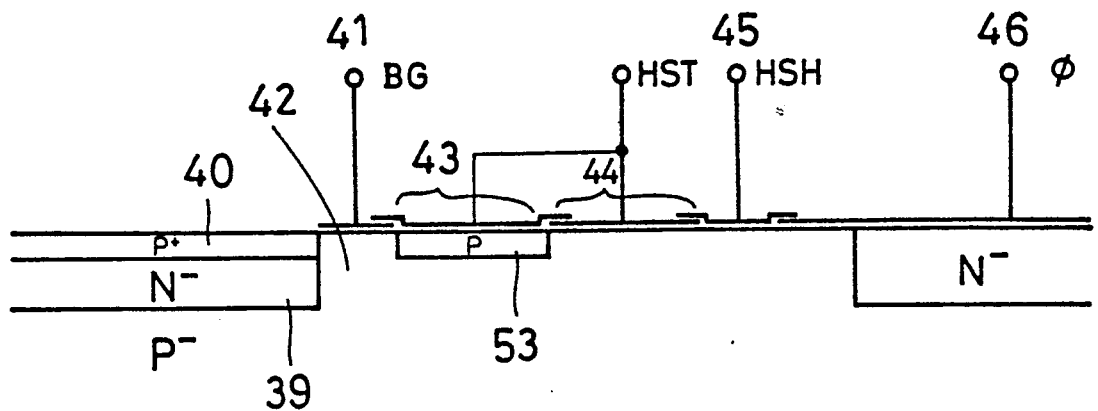
FIG. 17
(a) 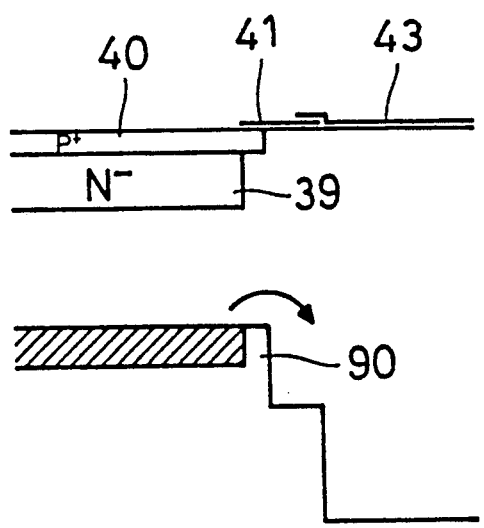
(b) 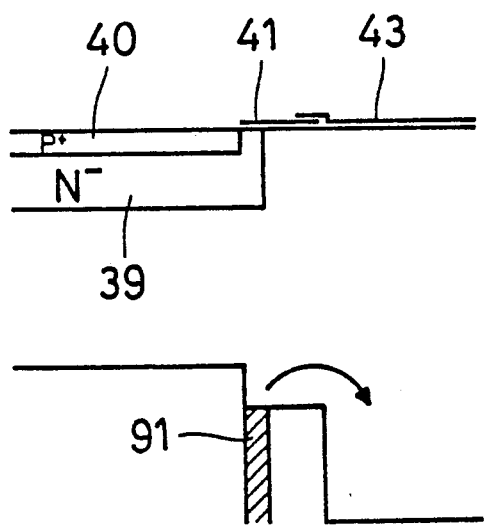

FIG. 32

$$\begin{pmatrix} Q_N \\ Q_{N-1} \\ \vdots \\ Q_i \\ \vdots \\ Q_2 \\ Q_1 \end{pmatrix} = \begin{pmatrix} 1-N\varepsilon & (N-1)\varepsilon & 0 & \cdots & 0 & 0 & 0 \\ 0 & 1-(N-1)\varepsilon & (N-2)\varepsilon & \cdots & 0 & 0 & 0 \\ \vdots & \vdots & \vdots & & \vdots & \vdots & \vdots \\ 0 & 0 & 1-i\varepsilon & (i-1)\varepsilon & \cdots & 0 & 0 \\ \vdots & \vdots & \vdots & & \vdots & \vdots & \vdots \\ 0 & 0 & 0 & \cdots & 1-2\varepsilon & \varepsilon \\ 0 & 0 & 0 & \cdots & 0 & 1-\varepsilon \end{pmatrix} \times \begin{pmatrix} Q_N^{(0)} \\ Q_{N-1}^{(0)} \\ \vdots \\ Q_i^{(0)} \\ \vdots \\ Q_2^{(0)} \\ Q_1^{(0)} \end{pmatrix}$$

CCD PHOTOSENSOR AND ITS APPLICATION TO A SPECTROPHOTOMETER

This invention relates to a photosensor using a solid state CCD (Charge Coupled Device) chip, the chip design of the CCD, and further to an application of the photosensor to a spectrophotometer.

BACKGROUND

A photosensor using a CCD has a great advantage in that only one amplifier is needed for the output signal because it has a simple one output terminal. But its rather narrow dynamic range has limited the application. For example, a common spectrophotometer requires a very wide dynamic range which the conventional normal CCD photosensor cannot cover.

Japanese laid-open patent publication No. S62-76765 discloses one solution to the problem: the floating diffusion of the output section of a CCD device is given a knee-shape characteristic to prevent saturation or overflow. This widens the dynamic range, but the output from this device does not have a linear relationship with the strength of the sensed light, and needs a linearization circuit. Further it is difficult to obtain a stable knee-characteristic due to manufacturing deviations. Japanese laid-open patent publication No. S63-63928 proposes another solution: the charge-generating time (integration time) is switched from one to the other. This device also requires an additional device control, and it cannot respond to a momentary change in the light strength.

SUMMARY OF THE INVENTION

The CCD photosensor used in the spectrophoto-measurement requires not only the wide dynamic range but also high accuracy, reliability and stability of the output in relation to the input light amount. This is the point that greatly differs from normal CCD photosensors used in imaging devices (or those used in video cameras).

When an accurate spectrophoto-measurement is to be performed, other cares (than improving the CCD photosensor) should be taken. That is, the incident light should be strictly decomposed into monochrome lights each having a narrow band of wavelength and should not include other components.

The objects of the present invention is therefore:

To provide a CCD photosensor that ensures an accurate, reliable and stable spectrophoto-measurement while giving a wide dynamic range of the measurement. Some measures of the present invention address this object by increasing the charge amount handled in every part of the CCD photosensor.

To provide an optical configuration to serve enhancing the accuracy of the spectrophoto-measurement.

To provide various signal processing methods for correcting the raw outputs of the CCD photosensor including some error by the transfer inefficiency.

To achieve these various objects, the CCD photosensor and the spectrophotometer according to the present invention adopts the following measures.

a. A plurality of bandpass filters are used in combination with a spectrofilter to eliminate the influence of undesirable sidebands inevitably accompanying the object monochrome light when passing through the spectrofilter (cf. FIG. 4). This optical configuration enhances the accuracy and reliability of the spectrophoto-measurement.

b. A high-sensitivity photosensor and a low-sensitivity photosensor are used to simultaneously sense an incident light (cf. FIGS. 9 and 10). The output of the high-sensitivity photosensor is adopted as the output of the integrated photosensor unless it is saturated. In any case, the output from either sensor is normalized to make the final output proportional to the incident light (cf. FIG. 28). This integrated photosensor widens the dynamic range.

c. A common transfer register array is placed between the two photosensor arrays (an array of high-sensitivity photosensors and an array of low-sensitivity photosensor arrays) in a CCD photosensor. Output signals of the both high- and low-sensitivity photosensors are sequentially obtained through one output terminal (FIGS. 18, 19 and 22). This simplifies the output amplifier and other peripheral circuits when the two (high- and low-sensitivity) photosensor arrays are simultaneously used.

d. The photodiode is completely buried in the substrate, which fixes the potential of the photodiode. The charge storage is also buried in the substrate and placed directly adjacent to the photodiode (FIGS. 16, 17 and 23). This structure enables omitting a barrier gate between them which formed a charge sink causing a rather great dark output.

e. The overflow gate of the CCD photosensor is controlled by a pulse signal so that the applied bias is set low (the potential of the overflow gate is high) when the photoelectric converting process is being carried out (and the charges are produced) at the photodiodes, while the bias is set high (the potential is low) when the photoelectric process ends to drain the excessive charges on the photodiodes that has not been transferred to the storage (cf. FIG. 14). This reduces the amount of residue charges causing the "lag", and enables an increase in the amount of charges produced in a photodiode and thus reduces the influence of shot noises on the output signal.

f. The charge storage of the CCD photosensor is applied with a pulse voltage that lowers the potential at the storage when the charges are being stored, while raises the potential when the charges are transferred to the transfer register (cf. FIGS. 14 and 15). This reduces the amount of residue charges, whereby the "lag" of the output is eliminated.

g. The charge storage is divided into two parts and potential differences are given to those parts to increase the total charge capacity while maintaining the charge readout time short (cf. FIGS. 11 and 12). This increases the handling charge amount at the storage.

h. A MOS capacitor is provided to the floating diffusion of the output circuit of the CCD photosensor chip to increase the charge handling amount at the output section (cf. FIG. 21).

i. The overflow drain is placed between neighboring photodiodes to reduce the "crosstalk" (charge leakage) between them. The overflow drain is formed by the N+ diffusion process after the polysilicon patterns are formed on the CCD chip, avoiding interference with the overflow gate (cf. FIGS. 11 and 13).

j. The influence of the transfer inefficiency is eliminated from the output signal by a correction calculation and the simplified measurement of the transfer inefficiency (cf. FIG. 32).

k. The transfer inefficiency is compensated for by a hardware configuration of the photodiodes and transfer registers, and an appropriate transfer driving method.

BRIEF EXPLANATION OF THE ATTACHED DRAWINGS

FIG. 1 schematically shows the structure of a spectrophotometer embodying the present invention.

FIG. 2(a) and 2(b) are a diagram and a graph explaining the decomposition of the incident light and the sensing of the decomposed monochrome light.

FIGS. 5(a), 5(b), 5(c), 5(d), 5(e) and 5(f) are graphs for explaining how the bandpass filter works in the embodiment.

Figure 6:
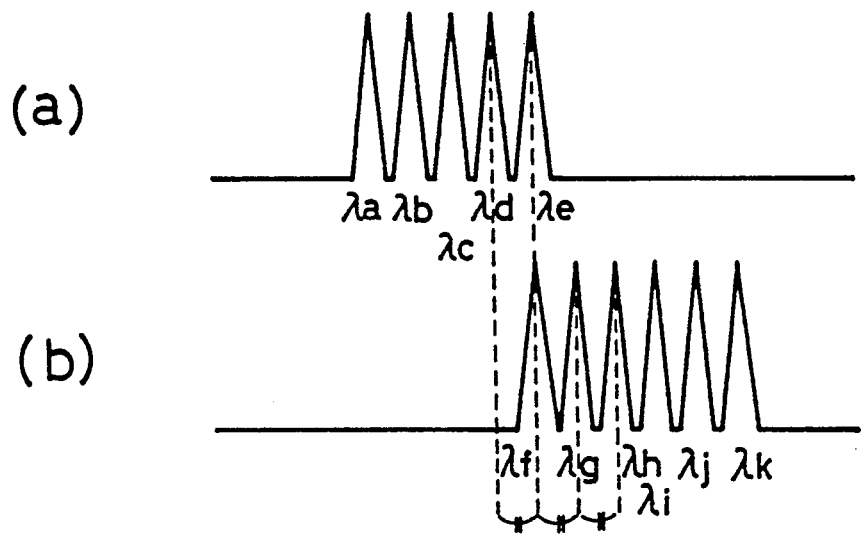

FIGS. 6(a) and 6(b) are graphs showing the continuity of the two CCD arrays of the embodiment.

Figure 7:
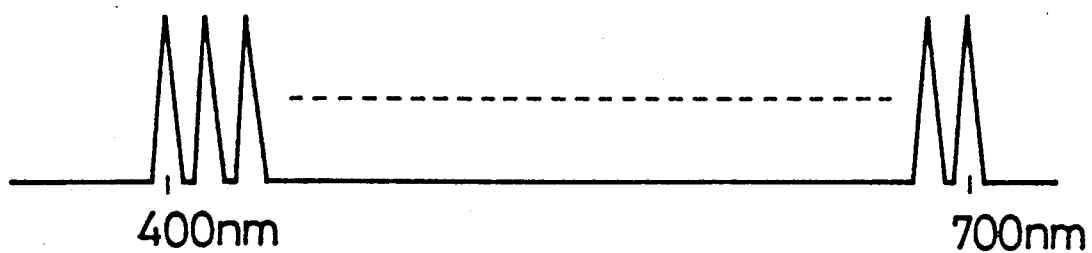

FIG. 7 is a spectrum diagram according to the spectrophotometer of the embodiment.

Figure 8:
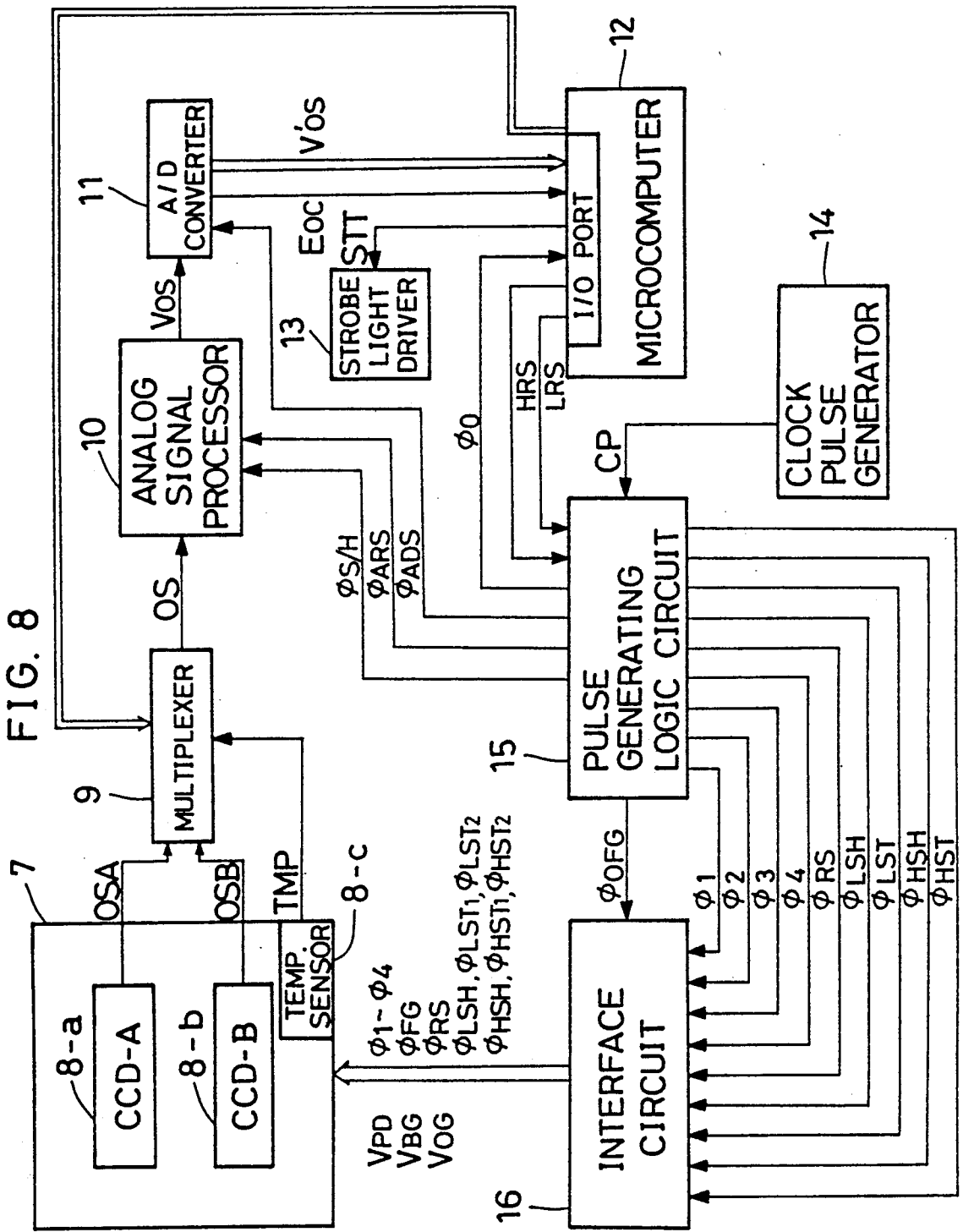

FIG. 8 is a block diagram showing the electrical connection of the embodiment.

Figure 9:
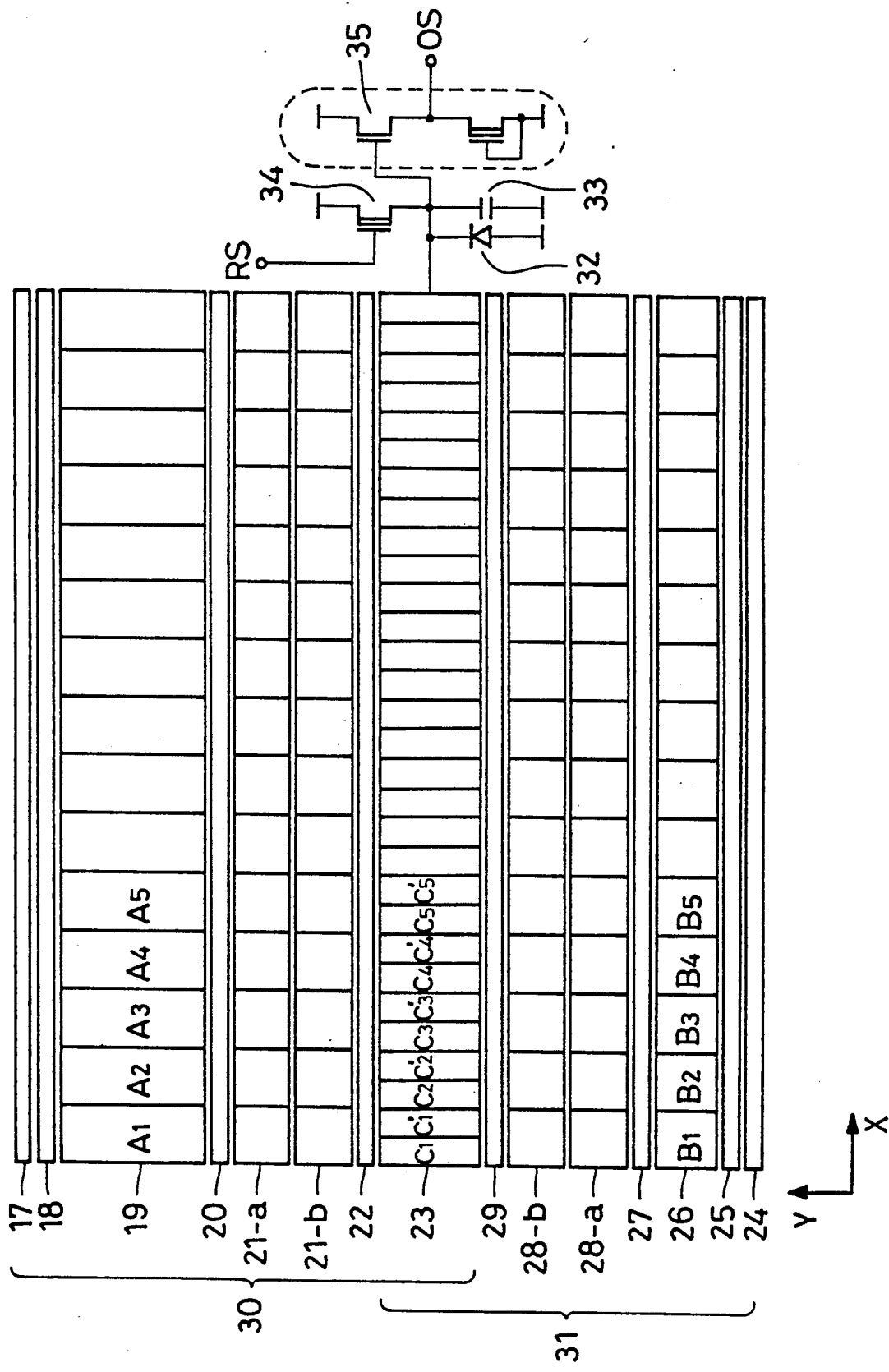

FIG. 9 is a plan view of a CCD photosensor array and the output section according to the embodiment.

FIGS. 10(a) and 10(b) are graphs for explaining how the dynamic range of the present embodiment is expanded.

Figure 11:
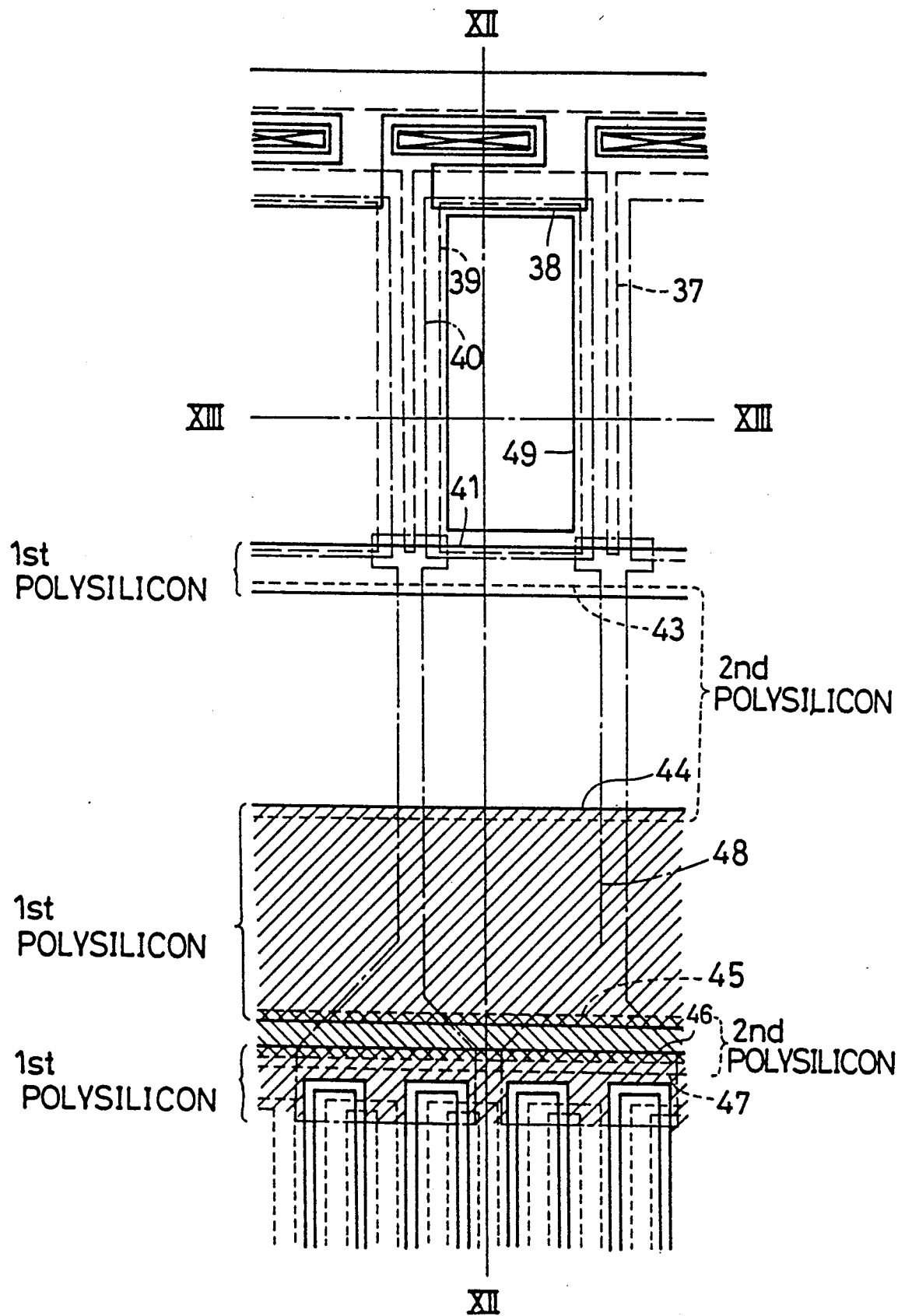

FIG. 11 shows the layer structure of the CCD chip of the embodiment.

FIG. 12(a) is a cross-sectional view taken along line XII—XII of FIG. 11, and FIG. 12(b) is a potential diagram of the cross-section.

FIG. 13(a) is a cross-sectional view taken along line XIII—XIII of FIG. 11, and FIG. 13(b) is a potential diagram of the cross-section.

Figure 14:
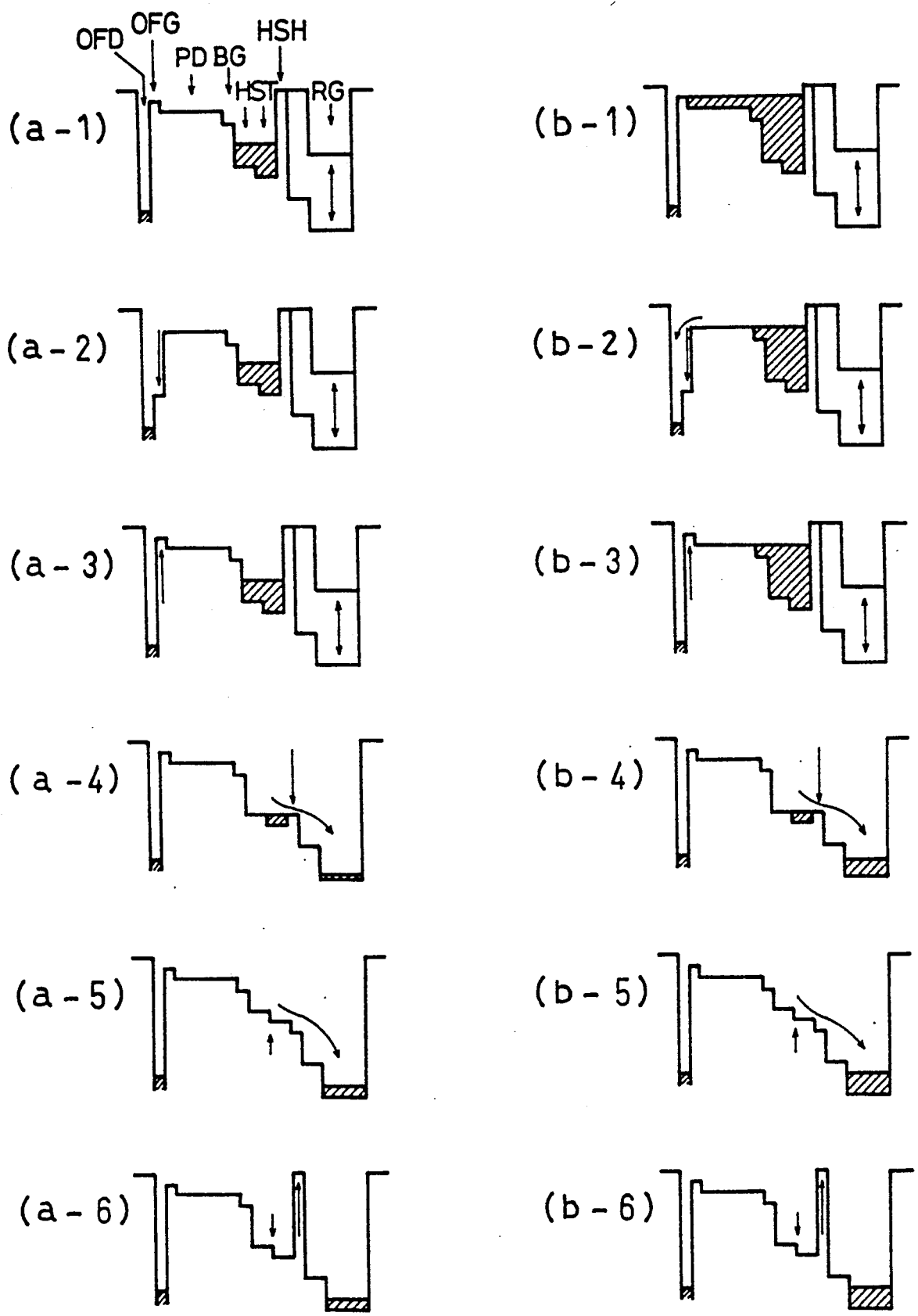

FIGS. 14(a-1), 14(a-2), 14(a-3), 14(a-4), 14(a-5), 14(a-6), 14(b-1), 14(b-2), 14(b-3), 14(b-4), 14(b-5) and 14(b-6) are potential diagrams showing how the charges are transferred to the transfer register.

Figure 15:
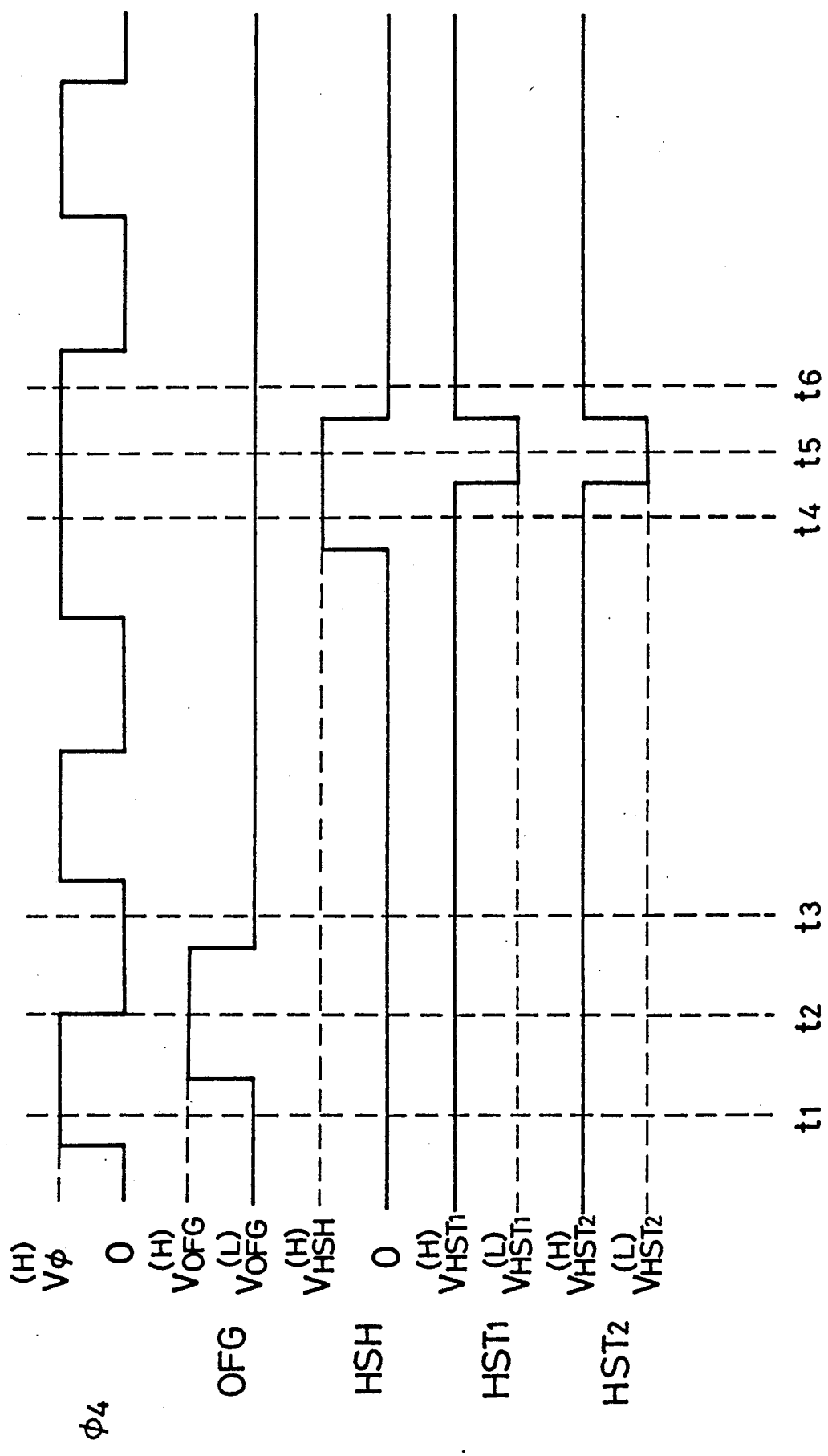

FIG. 15 is a timing chart corresponding to the process of FIG. 14.

FIG. 16 is a cross-sectional view of a CCD of the embodiment having a two-part storage.

FIGS. 17(a) and 17(b) are cross-sectional views and their potential diagrams of two typical examples of layer structure of a photodiode.

Figure 18:
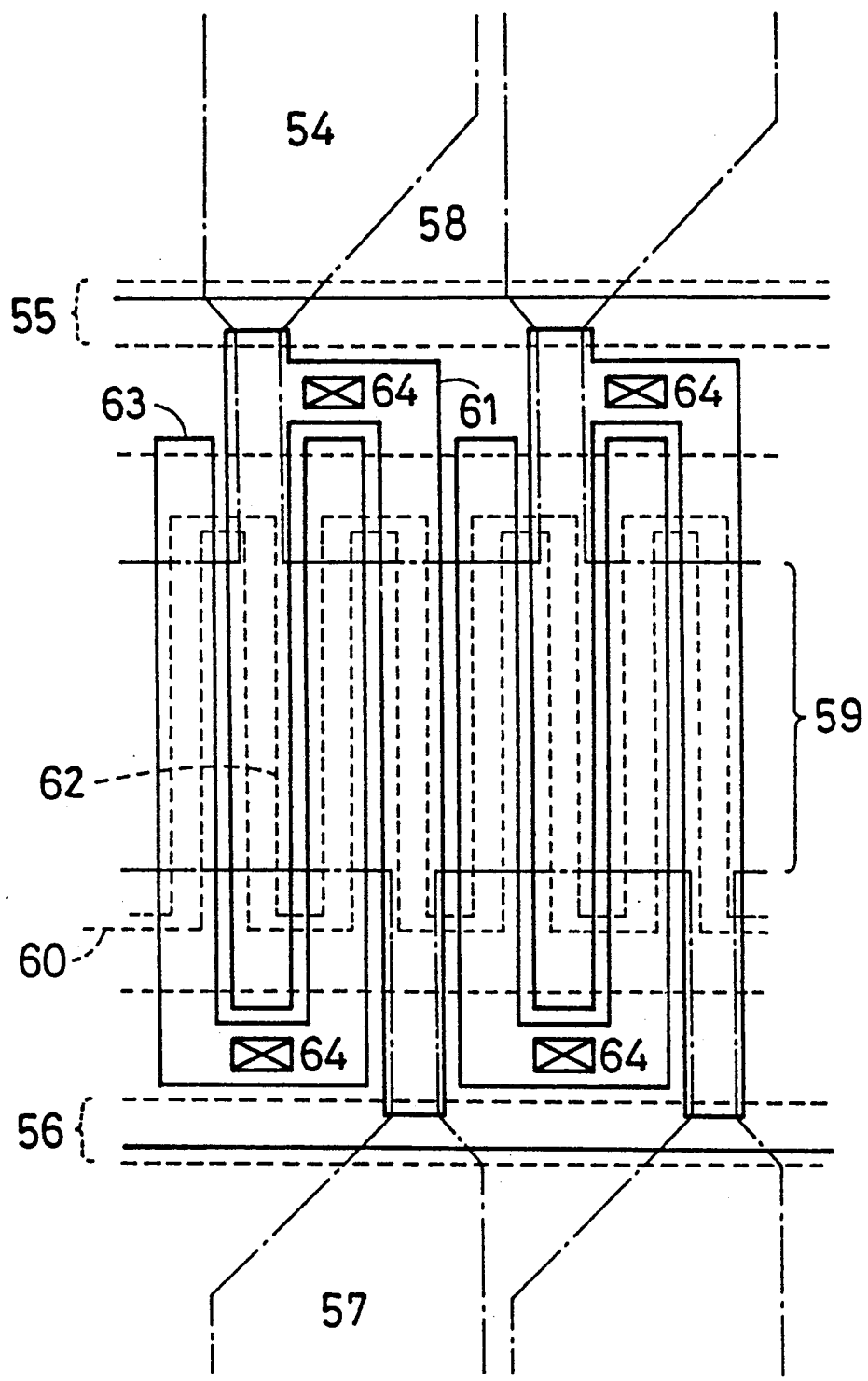

FIG. 18 shows the layer structure of the transfer registers of the CCD chip of the embodiment.

Figure 19:
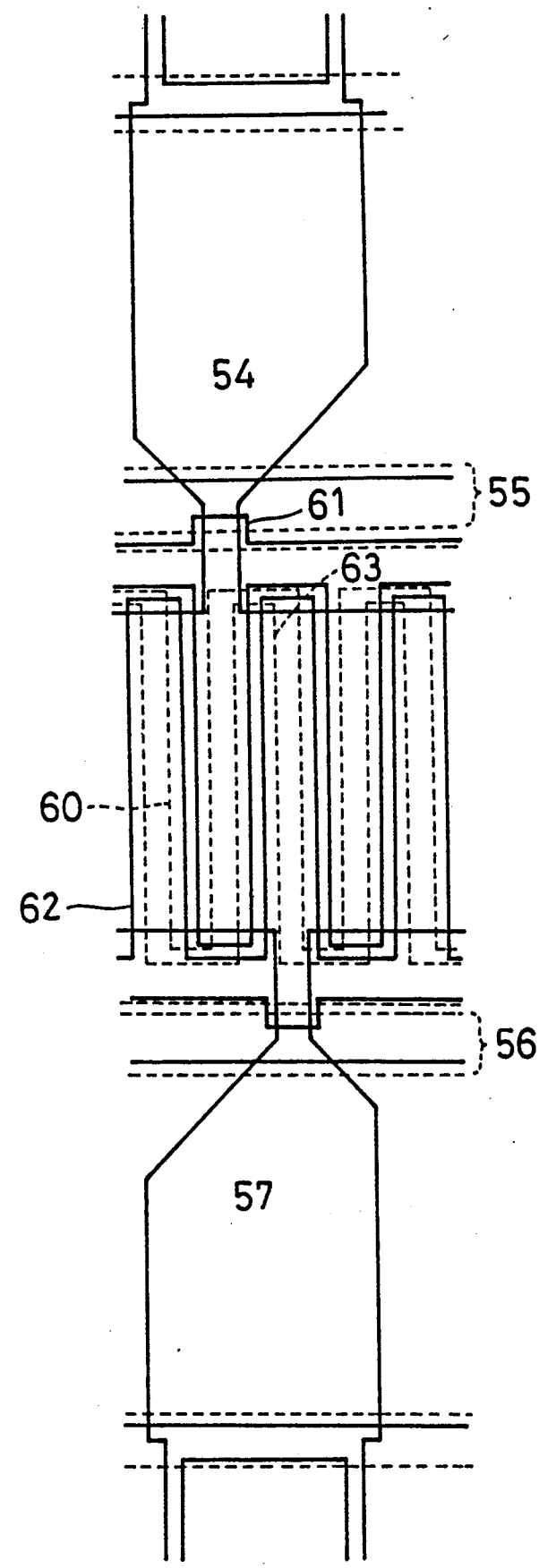

FIG. 19 is another example of the layer structure of the transfer registers.

Figure 20:
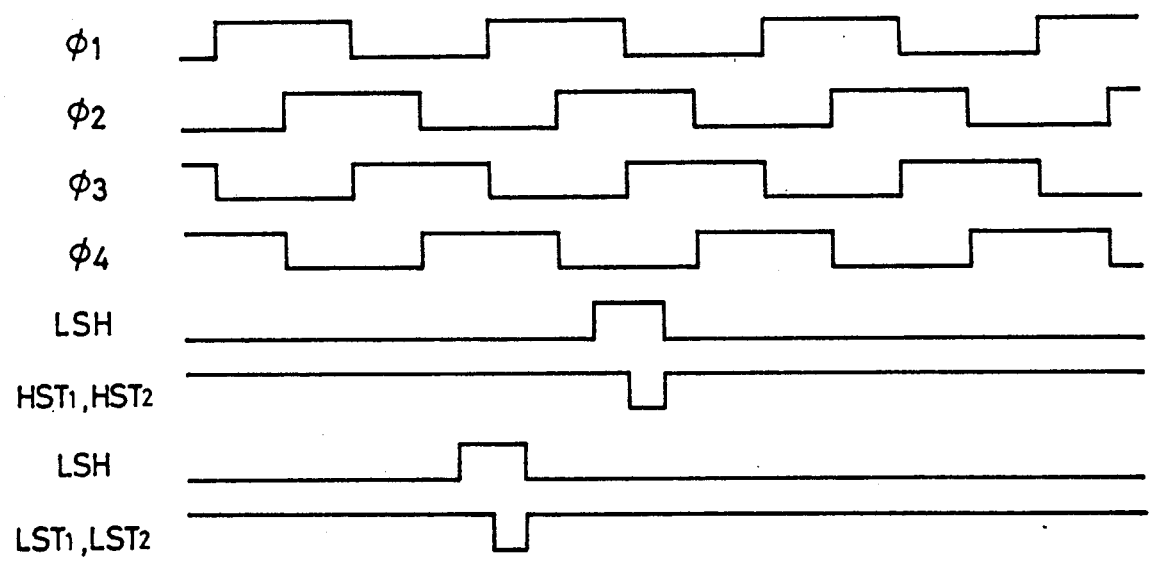

FIG. 20 is a timing chart of the transfer-driving pulses corresponding to the example of FIG. 19.

Figure 21:
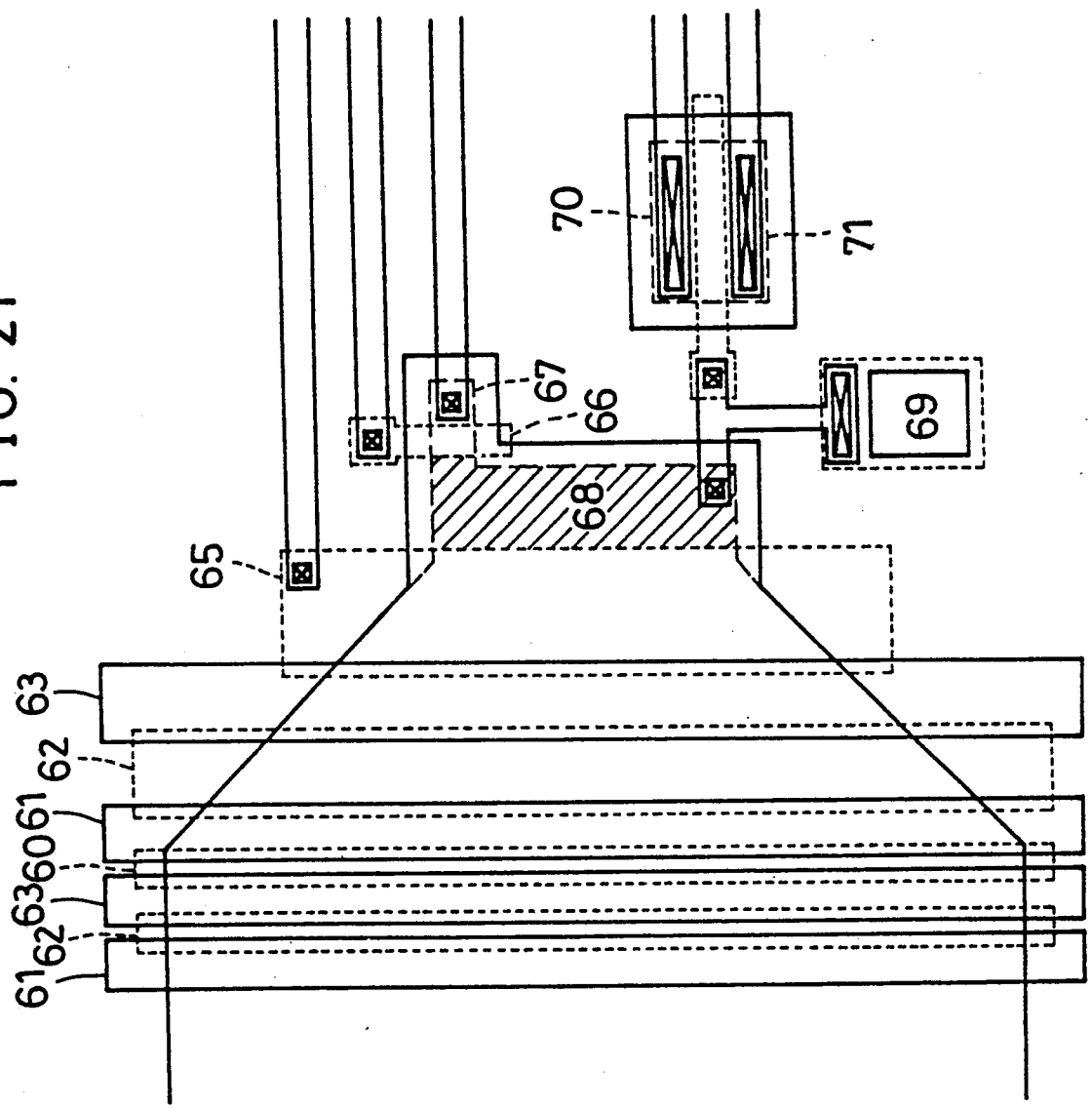

FIG. 21 is a plan view of the output section of the CCD of the embodiment.

Figure 22:
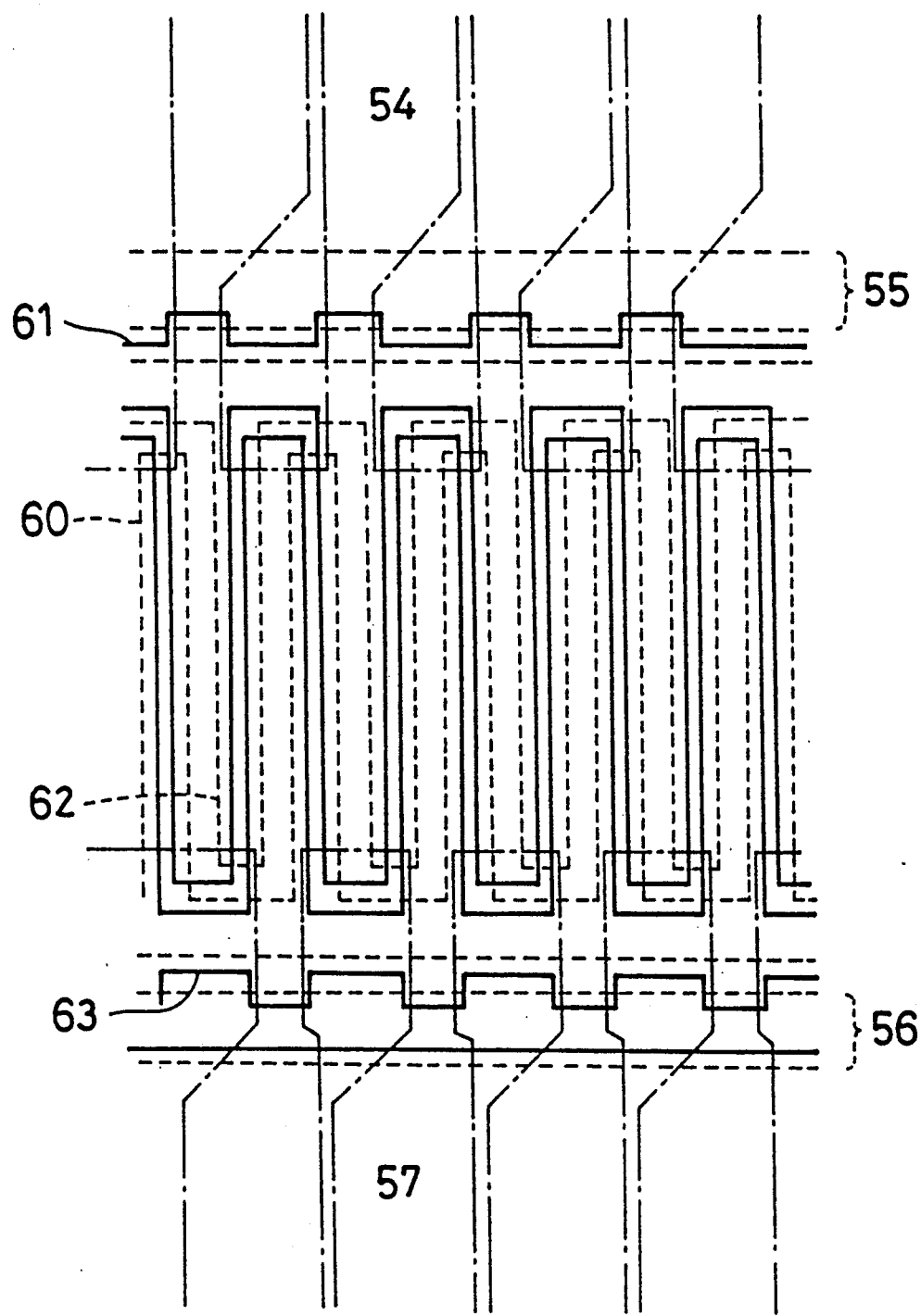

FIG. 22 shows a layer structure of the transfer registers of the CCD as another embodiment of the present invention.

Figure 23:
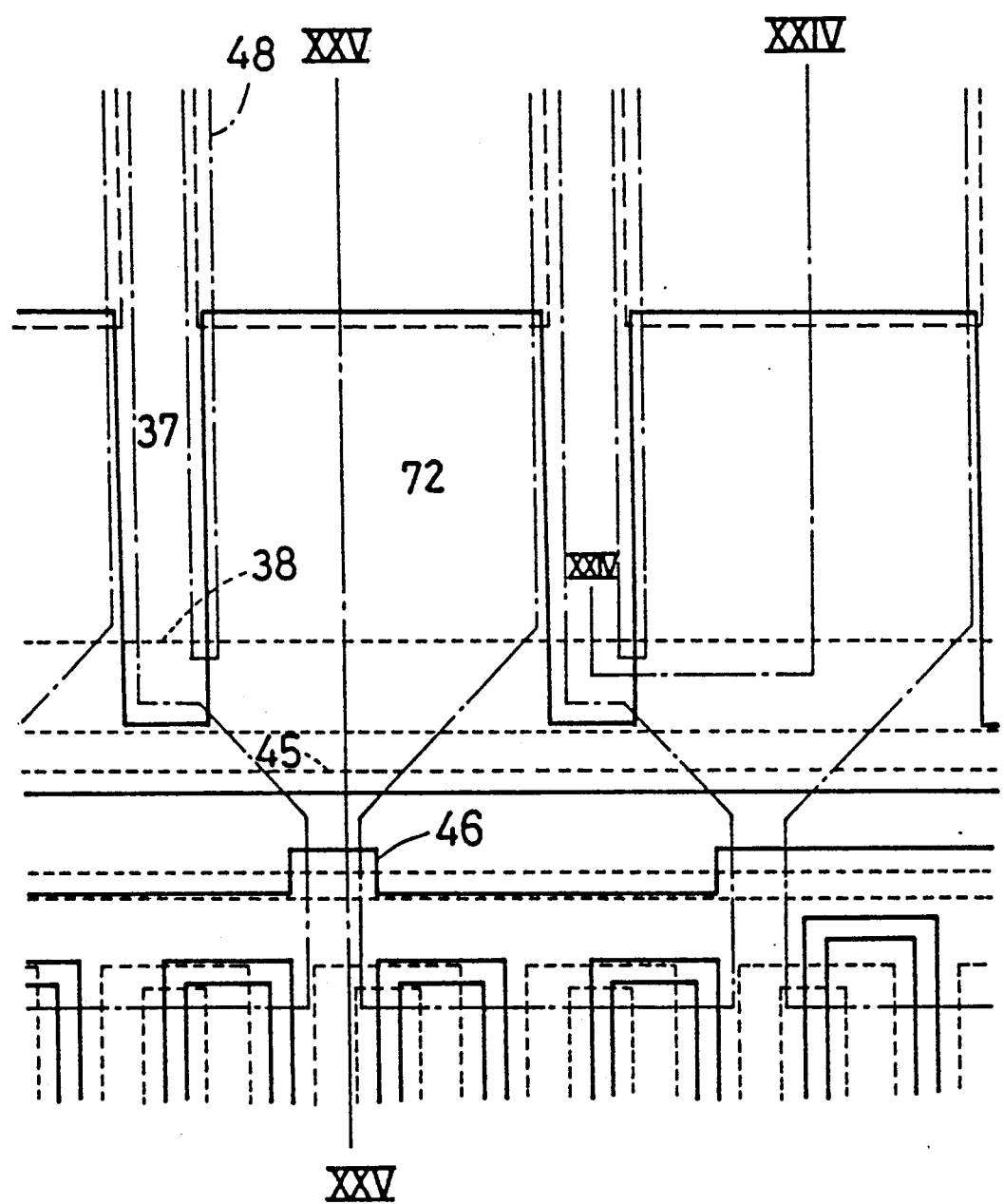

FIG. 23 shows a layer structure of the photosensing section of the CCD of the embodiment.

FIGS. 24(a) and 24(b) are a cross-sectional view taken along the line XXIV—XXIV of FIG. 23 and its potential diagram.

FIGS. 25(a) and 25(b) are a cross-sectional view taken along the bending line XXV—XXV of FIG. 23 and its potential diagram.

Figure 26:
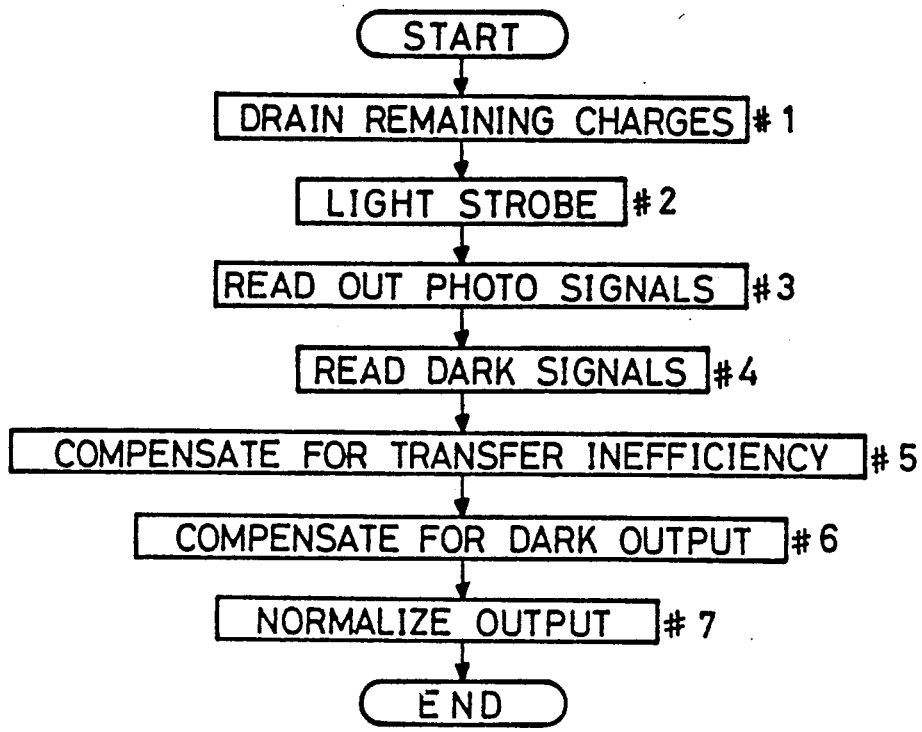

FIG. 26 is a flowchart of the spectrophoto-measurement according to the embodiment.

Figure 27:
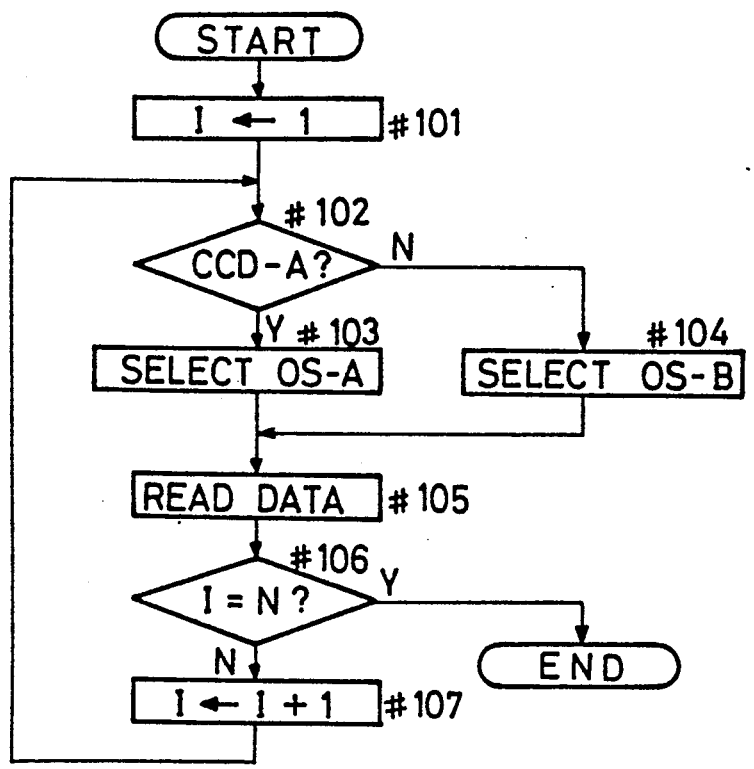

FIG. 27 is a flowchart of a subroutine for selecting either one of the two CCD arrays of the CCD chip of the embodiment.

Figure 28:
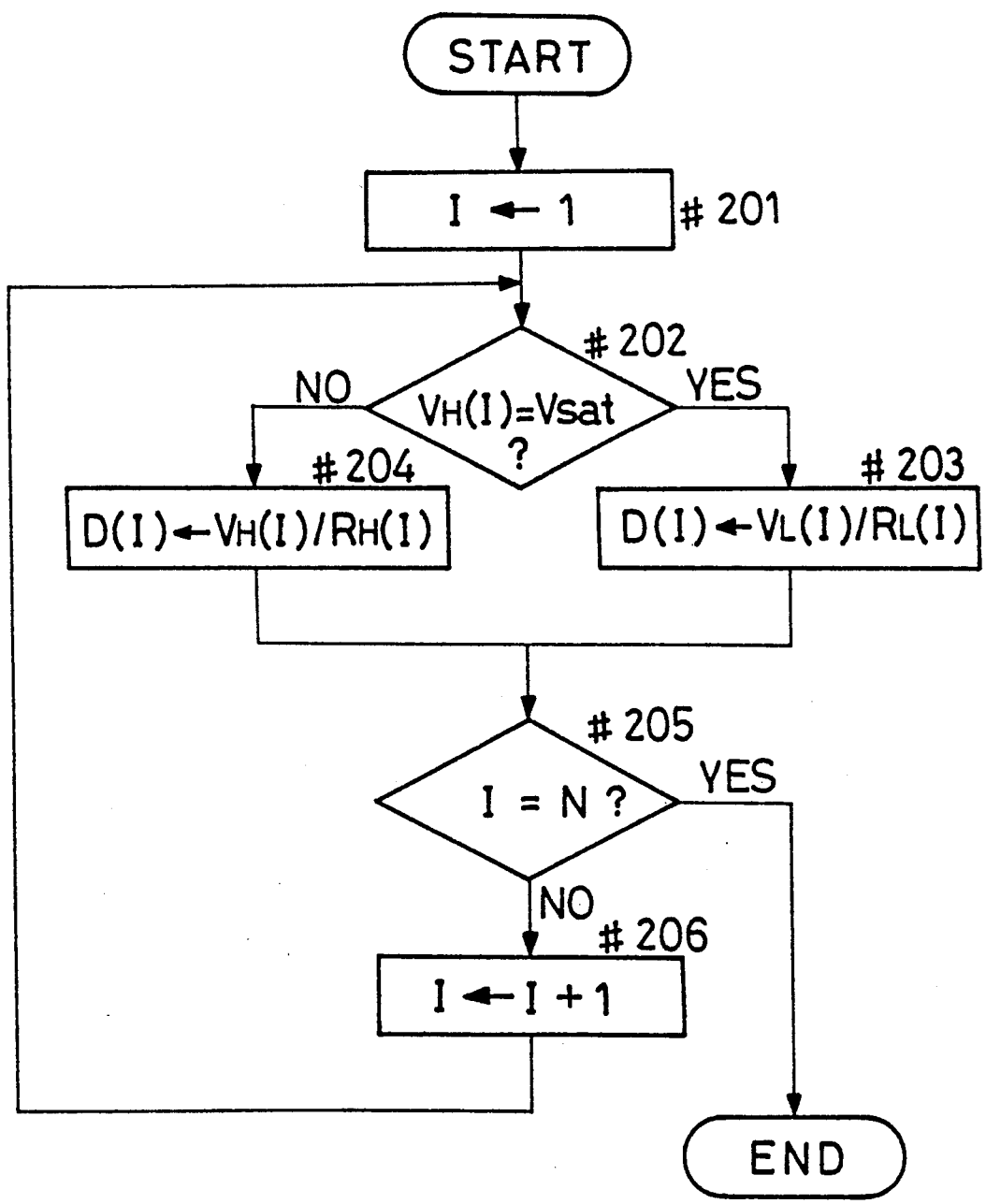

FIG. 28 is a flowchart of a subroutine for selecting one of two outputs from the high-sensitivity and low-sensitivity photosensors.

Figure 29:
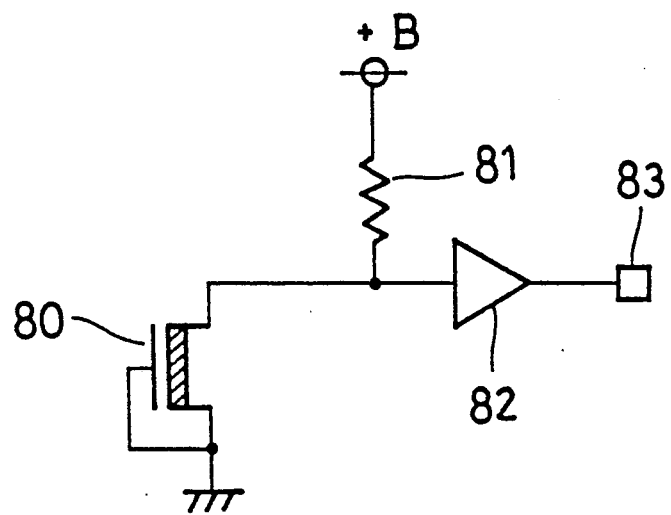

FIG. 29 is a circuit diagram of a temperature sensor of the CCD chip of the embodiment.

Figure 30:
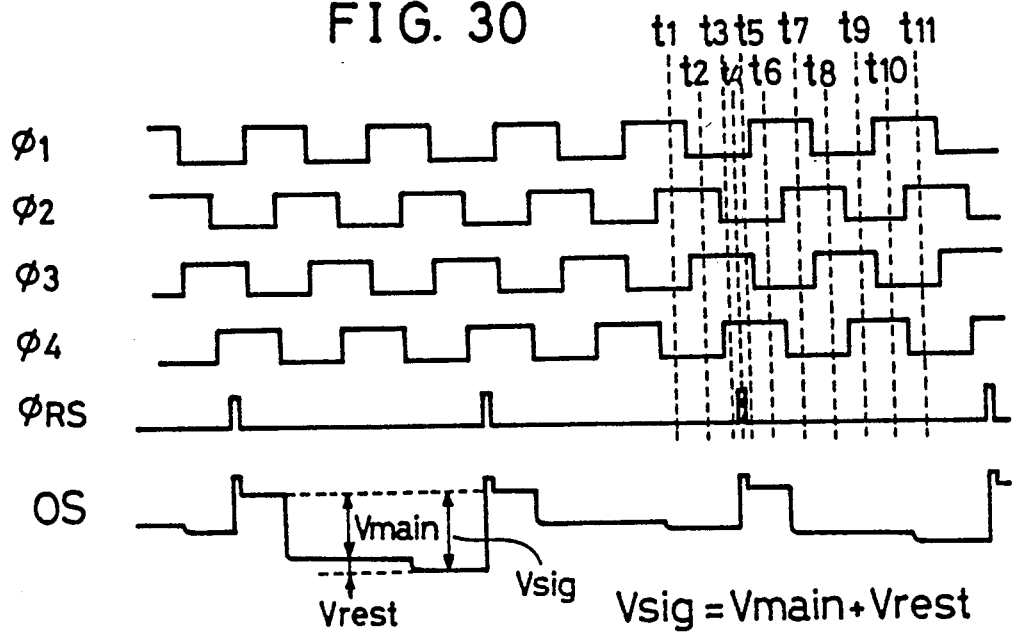
Figure 31:
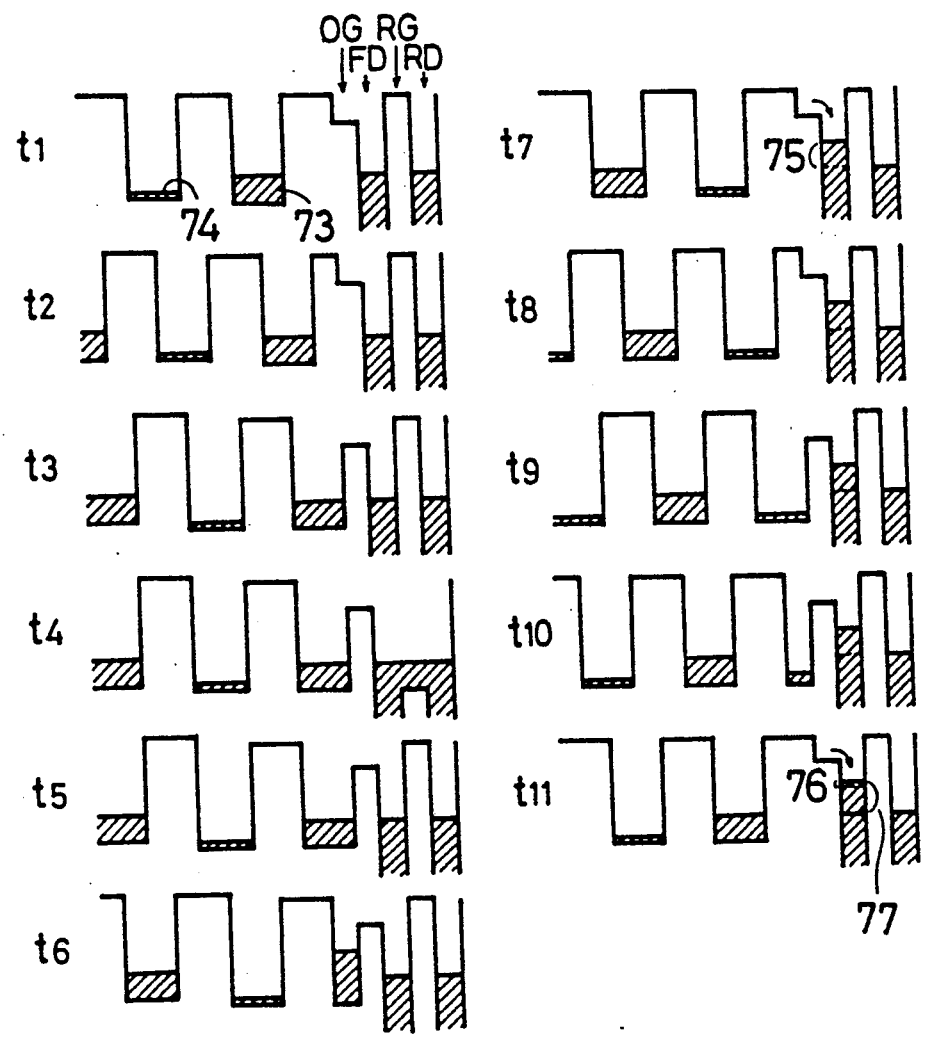

FIGS. 30 and 31 are a timing chart and potential diagrams showing how two packets are added by the hardware.

FIG. 32 is a matrix equation between the outputs and the original charge amounts.

DETAILED DESCRIPTION OF THE PREFERRED EMBODIMENTS

An embodiment of the present invention is a spectrophotometer, in which incident light is decomposed into many monochrome lights using a spectrofilter, and each monochrome light is sensed by a photodiode in a CCD line sensor including an array of photodiodes. This spectrophotometer can be used in analyzing light reflected from an object surface.

The description of the embodiment is conducted as:
I Principle and structure of a spectrophotometer
II Structure of a CCD line sensor used in the spectrophotometer of the present embodiment
  (1) CCD and peripheral components
  (2) Structure of a photoelectric cell of the CCD line sensor and its operation
    First example
    Second example
  (3) Structure of the common transfer registers and their operation
    First example
    Second example
    Third example
  (4) Structure of the output terminal of the transfer registers
III Operation of the CCD line sensor and the signal processing
  (1) Correction of the output for the transfer inefficiency
    First example
    Second example
    Third example
  (2) Spectrophoto-measurement
    Selection of the effective pixel
    Compensation for the dark output
    Correction for the sensitivity deviations I Principle and structure of a spectrophotometer The spectrophotometer embodying the present invention is constructed, as shown in FIG. 1, mainly of a bandpass filter 6, spectrofilter 1 such as an interference filter and a CCD line sensor 2. At one point, the spectrofilter 1 passes a monochrome light having a certain wavelength ("principal wavelength"), and the principal wavelength varies continuously along the X-axis while fixed along the Y-axis.

One example of such spectrofilter 1 is made as follows:

Glass/(HL)²2H(LH)⁵/Air, where H represents a dielectric layer with high refractive index, and L represents a dielectric layer with low refractive index. By determining the thickness d of each layer considering the following formula, such spectrofilter 1 can be obtained.

$$n \cdot d / \lambda = \frac{1}{4},$$

where n is the refractive index of the layer, and $\lambda$ is the principal wavelength.

Figure 3:
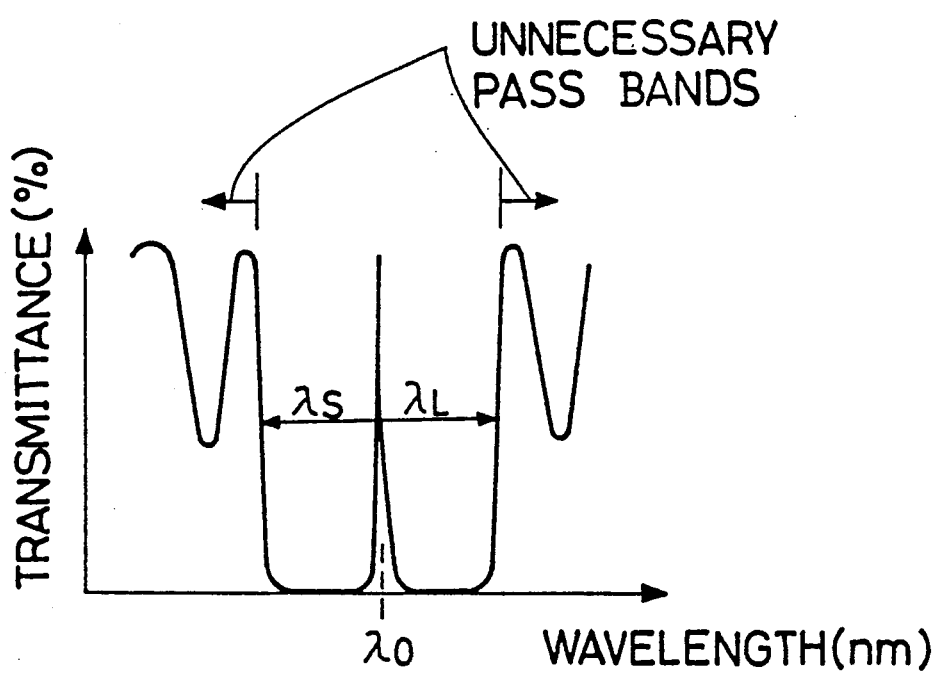
FIG. 3 is a graph showing the unnecessary passing bands accompanying the principal light passing at a position of the spectrofilter of the spectrophotometer.

The strength of lights of various wavelengths passing a certain point $(X_o, Y_o)$ of the spectrofilter 1 is shown in FIG. 3. Besides the principal light having wavelength of $\lambda_o$, unnecessary lights with wavelength shorter than $\lambda_o - \lambda_s$ and longer than $\lambda_o + \lambda_L$ passes the spectrofilter 1. When $TiO_2$ is used in the dielectric layer with high refractive index and $SiO_2$ is used in the dielectric layer with low refractive index, $\lambda_S$ and $\lambda_L$ is about 0.15 times $\lambda_o$. In using the spectrofilter 1 in the 400–700 nm wavelength region, $\lambda_S$ and $\lambda_L$ are about 75 nm at the principal wavelength $\lambda_o$ of 500 nm, which means that light with wavelength shorter than 425 nm and longer than 575 nm passes besides the principal wavelength $\lambda_o = 500$ nm. It is for this reason that the bandpass filter 6 is placed over the spectrofilter 1, as shown in FIG. 1.

Under the spectrofilter 1 is placed a CCD line sensor 2 having a plurality of unit photocells (pixels). As shown in FIGS. 2(a) and 2(b), the incident light 3 coming down in the Z-direction first passes through the bandpass filter 6 to be cut off the unnecessary sidebands, then through the spectrofilter 1 to be decomposed into monochrome lights, as with $\lambda_1$ and $\lambda_2$, and finally enters the CCD line sensor 2 to be converted into electric signals 5a and 5b representing the intensity of the respective monochrome lights.

Figure 4A:
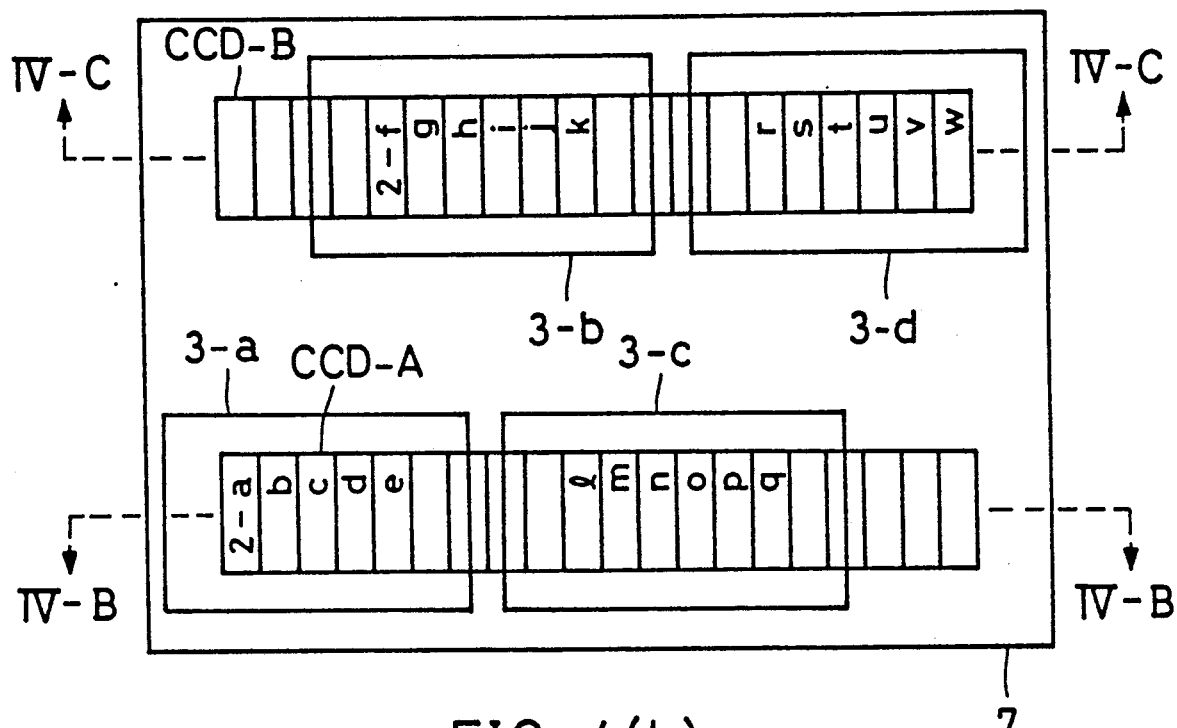
FIG. 4(a) is a plan view of the CCD, spectrofilter and bandpass filter of the embodiment.
Figure 4B:
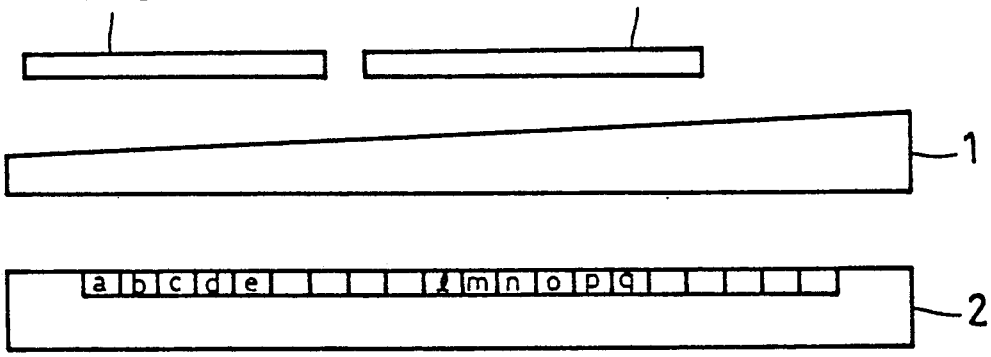
FIGS. 4(b) and 4(c) are cross-sectional views respectively taken along lines IV-B—IV-B and IV-C—IV-C of FIG. 4(a).
Figure 4C:
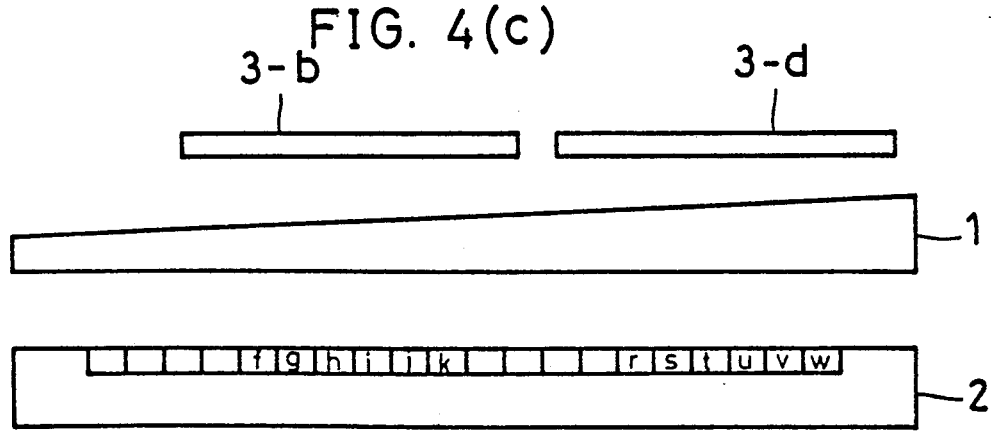

II Structure of a CCD line sensor used in the spectrophotometer of the present embodiment (1) CCD and peripheral components Geography of photocells (pixels) of the CCD line sensor 2, the spectrofilter 1 and the bandpass filter 6, as well as the spectroscopy by the arrangement, is explained with reference to FIGS. 4 through 7. As shown in FIG. 4(a), the CCD line sensor 2 of this embodiment is composed of two arrays CCD-A and CCD-B of pixels, and the bandpass filter 6 is composed of four segments 3-a, 3-b, 3-c and 3-d. A set of two segments (3-a, 3-c) or (3-b, 3-d) covers an array CCD-A or CCD-B, and the member segments of each set differ in the passing band.

The spectroscopy is explained referring to the bottom left segment 3-a of the bandpass filter 6. The transmission characteristic of the spectrofilter 1 at the pixel 2-a is shown in FIG. 5(a), and that at the pixel 2-e is shown in FIG. 5(c). The transmission characteristic of the bandpass filter segment 3-a is shown in FIG. 5(e), in which the shortside cutoff wavelength $\lambda_{CS}$ and the longside cutoff wavelength $\lambda_{CL}$ are set to satisfy the inequality $$\lambda_{Se} < \lambda_{CS} < \lambda_a.$$

and $$\lambda_e < \lambda_{CL} < \lambda_{La}.$$

where $\lambda_{Se}$ is the longest wavelength of the shortside unnecessary transmission band of spectrofilter 1 at pixel 2-e, $\lambda_{La}$ is the shortest wavelength of the longside unnecessary transmission band at pixel 2-a, $\lambda_a$ is the principal transmission wavelength at pixel 2-a, and $\lambda_e$ is that at pixel 2-e. Therefore, the overall transmission characteristic inclusive of the bandpass filter 6 and the spectrofilter 1 are as shown in FIGS. 5(b) and 5(d) respectively at pixels 2-a and 2-e, and the final spectrogram at the pixels 2-a through 2-e are as shown in FIG. 5(f) where the principal wavelengths sensed by the pixels 2-a through 2-e change at a constant pitch.

The continuity between the group of pixels 2-a through 2-e in the line A (CCD-A) and the group of pixels 2-f through 2-k in the line B (CCD-B) is now explained. The spectrograms of the two groups are shown in FIGS. 6(a) and 6(b) respectively. In each group, the principal wavelengths of the pixels differ at a constant wavelength-pitch because the pixels are placed at a constant site-pitch. Though the pixels in the line B is separated from those in the line A in the Y direction, the pixel 2-e and the pixel 2-f are arranged to place at the same X-coordinate. The pixel group (2-f through 2-k) and the pixel group (2-l through 2-q), and the latter and the group (2-r through 2-w) have the same relations. By so arranging the two line pixels 2-a through 2-w, the spectrofilter 1 and the bandpass filter segments 3-a through 3-d, the incident light is decomposed into monochrome lights with wavelengths separated equally in the range 400–700 nm, whereby an accurate spectrophotometry can be achieved. The same incident light is simultaneously sensed by two pixels in different lines in the above structure in order to always obtain the continuous output as shown in FIG. 7 when one of the pixel does not produce a normal output due to a manufacturing failure of the bandpass filter 6 or so and the above inequality of the cutoff wavelengths does not stands.

(2) Structure of the photoelectric cell of the CCD line sensor and its operation As described above, the CCD line sensor chip 7 includes the two linear pixel arrays CCD-A (8-a) and CCD-B (8-b). The chip 7 further includes a temperature sensor 8-c for compensating for the thermal drift of the photosensing outputs.

Temperature sensor: An example of the temperature sensor 8-c is shown in FIG. 29. This example uses a depletion-type MOS-FET 80, which adopts the same buried structure as the CCD photosensor (described later) with N⁻ layer on the P-substrate. The gate and the source of the FET 80 both connects to the ground, whereby this FET 80 works as a constant-current source whose current changes according to the chip temperature. Suppose the carrier concentration in the N⁻ layer is $1 \times 10^{16}$ cm$^{-3}$, and its depth is 1.0 μm, the current I (T) at temperature T is $$I(T) = I(T_o) \cdot \{1 + \alpha_1 \cdot (T_1 - T_o)\}.$$

where $T_o$ is a reference temperature. In the above case, the thermal coefficient $\alpha_1$ is about 5600 ppm. The drain of the FET 80 connects to the source voltage B (12 V) via a resistance 81 of 20 kΩ, which is prepared outside of the chip 7, having thermal coefficient of ±150 ppm. The temperature-dependent voltage at the junction of the drain and the resistance 81 is detected at the output terminal 83 through a buffer amplifier 82 for impedance matching. If the current through the FET 80 is set at 50

μA, the working point of the output is 11 V, and the output deviation due to temperature change is $$\Delta V_{TMP}/(T-T_o) = 5.5 \text{ mV/deg},$$

which makes a high sensitivity temperature sensor.

Signal processors: Returning to FIG. 8, the outputs from the pixel arrays 8-a and 8-b and the temperature sensor 8-c (OSA, OSB and TMP respectively) are transmitted through the multiplexer 9 to an analog signal processor 10 as a signal OS. The analog signal processor 10 shapes and amplifies the output signal OS of the CCD line sensor 7 to make a signal $V_{OS}$ to pass to an A/D converter 11. The signal $V_{OS}$ is digitized in the A/D converter 11 and is sent to a microcomputer 12 with an A/D-end code EOC.

Controllers: A clock pulse generator 14 generates clock pulse signal CP using a crystal oscillator to give it to a pulse generator logic circuit 15. Using the clock pulse signal CP and CCD control signals HRS and LRS from the microcomputer 12, the pulse generator logic circuit 15 generates various CCD driving pulse signals, such as $\phi_{OFG}$, $\phi_1$, $\phi_2$, $\phi_3$, $\phi_4$, $\phi_{RS}$, $\phi_{LSH}$, $\phi_{LST}$, $\phi_{HSH}$ and $\phi_{HST}$, and sends them to an interface circuit 16. The pulse generator logic circuit 15 further makes and sends signal-processing-timing pulse signals $\phi_{S/H}$ and $\phi_{ARS}$ to the analog signal processor 10, and an A/D-starting pulse signal $\phi_{ADS}$ to the A/D converter 11. The interface circuit 16 changes the amplitude of the received pulse signals to adapt to the CCD level, and includes itself a DC-bias generator to be used for the CCD sensor 7. The spectrophotometer of the present embodiment uses a strobe light as the light source, so a strobe driving circuit 13 is prepared under the control of the microcomputer 12 by a strobe trigger signal STT.

CCD line sensor: Since the pixel arrays CCD-A and CCD-A have the same structure, the following description is made for one of them CCD-A 8-a (which will be simply referred to as CCD). The structure of the CCD is as shown in FIG. 9, in which the X and Y directions are the same as those in FIG. 1 (i.e., the principal wavelength of light passing through the spectrofilter 1 changes in the X direction but fixed in the Y direction). A significant structure of the CCD of the present embodiment is that it has two kinds of photosensor rows: one 30 having high sensitivity and the other 31 having low sensitivity. The high-sensitivity photosensor rows 30 and the low-sensitivity photosensor rows 31 are placed parallel along the X direction with a common transfer register 23 between them. Outside (top and bottom in FIG. 9) of the two photosensor rows 30 and 31 are placed overflow drain 17 and 24 to drain charges overflowing from the photodiodes 19 and 26 of the photosensors 30 and 31. The drainage of each overflow drain 17 or 24 is controlled by an overflow gate 18 or 25. Electrical charges generated at the photodiodes 19 and 26 are transferred via barrier gates 20 and 27 to storages 21-a, 21-b, 28-a and 28-b, and are temporarily stored there. Then the charges are transferred to the common transfer registers 23 via transfer gates 22 and 29, and the linearly arranged transfer registers 23 transfer the charges from one to the neighbor until the output of this CCD. As described before, light passing through a certain X-directional position $X_o$ of the spectrofilter 1 enters simultaneously into a high-sensitivity photodiode 19 and into a low-sensitivity photodiode 26. In this embodiment, one 19 of the photodiodes has a larger surface area than the other photodiode 26 so that the larger photodiode 19 has the higher sensitivity.

In this embodiment, since the transfer registers 23 are commonly used for the high-sensitivity photosensors 30 and low-sensitivity photosensors 31, the number of the transfer registers 23 is the sum of the number of photodiodes 19 and 26 of the both photosensors 30 and 31, and the site-pitch of the transfer register array 23 is half that of the photodiode array 19 or 26. The charges generated in the high-sensitivity photodiodes 19 (A1, A2, ...) and temporarily stored in the respective storages 21-a and 21-b are transferred to the transfer registers at odd numbers (C1, C2, ...) by applying a bias voltage on the transfer gate 22, and the charges generated in the low-sensitivity photodiodes 26 (B1, B2, ...) and temporarily stored in the respective storages 28-a and 28-b are transferred to the transfer registers at even numbers (C1', C2', ...) by applying bias on the transfer gate 29. Thus charges of all photodiodes 19 and 26 (A1, A2, ..., B1, B2, ...) are transferred to the transfer registers 23, and then transferred in the transfer registers 23 (C1→C1'→C2→C2'→ ...) until the output terminal. The number of charges at the output terminal is converted into a voltage by a capacitor 33, and then it is sent out from the output terminal as the output signal OS (OSA or OSB) via the impedance-matching buffer 35. The output circuit further includes a diode 32 and an FET 34 for discharging the remaining charges before the new (next) charges come in.

The above structure of the present embodiment gives a very broad dynamic range to CCD sensors, which is especially suitable for use in spectrophotometer. The reason of the expansion of the dynamic range is explained now.

FIG. 10(a) is a graph of output voltage of a conventional CCD sensor against input light amount. In the region I where the coming light amount is less than $L_o$, the output is constant (dark output $V_{dark}$) irrespective of the input light amount whereby the sensor is not effective in this region I. In the region III where the input light amount is greater than $L_1$, the pixel photosensor is saturated by the generated charges and the output is constant at $V_{sat}$ whereby also the sensor is not effective. After all, the conventional sensor is effective only in the middle region II (whose width is the dynamic range). The dynamic range is approximately 2–3 orders (about 1:100 to 1:1000), which is insufficient to be used in spectrophotometers.

In the present embodiment, the CCD sensor includes two kinds of photosensors having different sensitivities as shown in FIG. 10(b). The curve 36a of FIG. 10(b) is the output of the high-sensitivity photosensor and the curve 36b is the output of the low-sensitivity photosensor. In this case: in the region I where the input light amount is less than $L_{ao}$, both high-sensitivity and low-sensitivity photosensors output the dark voltage $V_{dark}$ and the sensor is not effective; in the region II-a where the input is between La0 to Lb0, the high-sensitivity photosensor produces an output corresponding to the input while the low-sensitivity photosensor outputs the constant $V_{dark}$; in the region II-b where the input is between Lb0 to La1, both high-sensitivity and low-sensitivity photosensors produce outputs corresponding to the input; in the region II-c where the input is between La1 to Lb1, the high-sensitivity photosensor outputs the constant $V_{sat}$ while the low-sensitivity photosensor outputs according to the input; and in the region III where the input is greater than Lb1, both outputs are $V_{sat}$.

Thus in this embodiment, the sensor is effective in the regions II-a, II-b and II-c, which is broader than the conventional effective region II. The expanded dynamic range allows its use in spectrophotometers. The effective regions of the high-sensitivity and low-sensitivity photosensors are overlapped in the region II-b because the output can be always obtained even when the limit values La0, La1, Lb0 and Lb1 deviate in the manufacture.

Here the detailed structure of the photosensors of the present embodiment is described with reference to FIGS. 11 to 13. Since the high-sensitivity and low-sensitivity photosensors 30 and 31 in FIG. 9 have the same structure except the size, the description is made for the high-sensitivity photosensor 30.

As shown in the plan view of FIG. 11, sectional view of FIG. 12($a$) along the line XII—XII of FIG. 11, and the potential diagram FIG. 12($b$) corresponding to the sectional view of FIG. 12($a$), the photodiode PD in this embodiment is a buried type with an $N^-$ layer 39 and a $P^+$ layer 40 on a P-type substrate 42. Since the $N^-$ layer 39 is sandwiched between the P-substrate 42 and the $P^+$ layer 40, it becomes a complete depletion layer and its potential is fixed at $\phi_{PD}$. The $N^+$ layer 37 makes the overflow drain OFD which drains excessive charges overflowing from the photodiode PD when applied a positive voltage $V_{OFD}$. The electrode 38 makes the overflow gate OFG, which has a MOS structure with the first polysilicon layer on a P-substrate 42 via $SiO_2$ layer of 100 nm thickness. A pulse signal is applied on the OFG terminal: when the pulse is at H-level, the potential in the substrate 42 under the OFG electrode 38 is $\phi_{OFG}^{(H)}$ that bears the relation $\phi_{OFD} < \phi_{OFG}^{(H)} < \phi_{PD}$; and when the pulse is at L-level, the potential is $\phi_{OFG}^{(L)}$ that bears the relation $\phi_{SUB} > \phi_{OFG}^{(L)} > \phi_{PD}$ ($\phi_{SUB}$ is the potential of the substrate 42, which is zero). By switching the voltage on the overflow gate electrode 38 ON and OFF, the charge flow between the photodiode PD and the overflow drain OFD 37 can be controlled.

The electrode 41 is the barrier gate BG which is made of the first polysilicon layer on the substrate 42 via the 100 nm-thick $SiO_2$ layer. By applying an appropriate voltage to this BG electrode 41 to make the potential $\phi_{BG}$ under the electrode 41 as $\phi_{BG} < \phi_{PD}$, the charges in the photodiode PD moves to the storages HST1 and HST2. Electrodes 43 and 44 make two storages HST1 and HST2 respectively each having the MOS structure. The first storage HST1 43 is formed by the first polysilicon layer and the second storage HST2 44 is formed by the second polysilicon layer on the substrate 42 via the 100 nm-thick $SiO_2$ insulator. Each electrode 43 or 44 is applied a pulse signal and the potentials under the electrodes 43 and 44 when the pulse is in H-level are $\phi_{HST1}^{(H)}$ and $\phi_{HST2}^{(H)}$ respectively. Here the voltages applied to the two electrodes 43 and 44 are given a difference of about 1 V to make $\phi_{HST1}^{(H)} < \phi_{HST2}^{(H)}$. When the pulse signal is in L-level, the potentials are $\phi_{HST1}^{(L)}$ and $\phi_{HST2}^{(L)}$ respectively, and the applied voltages are determined so that always $\phi_{PD} > \phi_{HST1}^{(L)} > \phi_{HST2}^{(L)}$.

The electrode 45 makes the transfer gate HSH with the second polysilicon electrode on the P-substrate 42 via the 100 nm-thick $SiO_2$. This HSH electrode 45 also receives a pulse signal, where the potential $\phi_{HSH}$ under the electrode 45 is zero when the pulse is at L-level and is $\phi_{HSH}^{(H)}$ at H-level. Here the H-level is set so that $\phi_{HSH}^{(H)} < \phi_{HST2}^{(L)}$.

The electrode 46 of the first polysilicon and the $N^-$ layer 47 (with the 100 nm-thick $SiO_2$ insulator therebetween) make the transfer register having the two-layer polysilicon, four-phase driven structure. In this embodiment, the $N^-$ layer 47 exists under a portion (right-hand side in FIG. 12($a$)) of the electrode 46, which makes the buried channel transfer register. The other portion of the electrode 46 between the transfer gate HSH 45 and the $N^-$ layer 47 makes the surface channel MOS structure. When the pulse signal on the electrode 46 is in L-level, the potential at the surface channel portion is almost zero, and when in H-level, the potential is $\phi_S^{(H)}$. At the buried channel portion, the potential is $\phi_B^{(L)}$ at L-level and $\phi_B^{(H)}$ at H-level. Here the bias voltage on this electrode 46, the doping concentration in the $N^-$ layer and its depth are determined so that the potentials $\phi_S^{(H)}$ and $\phi_B^{(H)}$ of the two portions at H-level become $\phi_B^{(H)} < \phi_S^{(H)} < \phi_{HSH}^{(L)}$. In FIG. 11, solid lines delimit the first polysilicon layer and broke lines delimit the second polysilicon layer.

The XIII—XIII section of the structure is explained referring to FIGS. 13($a$) and 13($b$). As the $N^-$ layer 37 of the overflow drain is formed at the same time as the source-drain of the output FET of the CCD, it is formed after the first polysilicon layer. Since the $N^-$ layer 37 should electrically connect to the overflow drain OFD in the XII—XII section (FIG. 12($a$)), the overflow gate 38 is partially cut (FIG. 11) to make the connection path. Thus the electrical connection is assured even when the $N^-$ layer 37 is formed after forming the first polysilicon layer. The $N^-$ layer 39 and the $P^+$ layer 40 make a photodiode. Since the upper $P^-$ layer 40 completely covers the $N^-$ layer 39, the photodiode has the buried structure, and the peripheral excessive portion of the $P^+$ layer 40 beyond the $N^-$ layer 39 works as the channel stop that prevents formation of the surface channel. The whole chip except the windows at the photodiode portion is covered by a photoprotection layer.

As shown by the broken lines in FIG. 13($a$), depletion zones 50 and 51 in the P-substrate 42 are formed under the overflow drain 37 and under $N^-$ layer 39 of the photodiode. The depth $L_{DOFD}$ of the depletion zone 50 under the overflow drain 37 is greater than that 51 under the photodiode. Therefore, the carriers generated by the photoelectric reaction under the photodiode within the depth $L_{DOFD}$ are trapped by the depletion zone 50 under the overflow drain 37, whereby their leak to the neighbor photodiode is prevented. Carriers generated deeper than the depth $L_{DOFD}$ die out by recoupling before reaching the neighbor photodiode. After all, the "crosstalk" between neighbor photodiodes are minimized in the present CCD, which gives high reliability in quantitative measurement.

The integral read-out process is then described referring to FIGS. 14 and 15. Since high-sensitivity and low-sensitivity photosensors are simultaneously used in this embodiment, the CCD should work properly when the high-sensitivity photosensor saturates. So the process is explained separately in the unsaturated case (FIG. 14, (a-1) to (a-6)) and in the saturated case ((b-1) to (b-6)).

At time t1 of FIG. 15, the potential state of an unsaturated photosensor is as (a-1) and that of a saturated photosensor is as (b-1) of FIG. 14. Before this time t1, charges generates by the strobe light irradiation in the high-sensitivity and low-sensitivity photodiodes are stored in respective storage HST. The excessively generated charges beyond the capacity of the storage HST overflow to the overflow drain OFD through the overflow gate OFG, whose potential is set at $\phi_{OFG}{}^{(L)}$. Since $\phi_{OFG}{}^{(L)} < \phi_{HSH}{}^{(L)}$, as described before, the excessive charges do not flow into the transfer register RG (a-1) and (b-1).

At time t2 when H-level voltage is applied on the overflow gate OFG, its potential lowers to $\phi_{OFG}{}^{(H)}$ (a-2) and (b-2), and the charges in the photodiode PD flows into the overflow drain OFD, while charges remain in the storage HST and in the barrier gate BG. This drainage is executed to reduce the amount of charges that the transfer registers RG should transfer because too large transfer amount requires enlarged transfer channel width.

At time t3, the overflow gate voltage is returned to L-level to raise the potential and stop the drainage (a-3, b-3).

At time t4 when H-level voltage is applied on the $\phi_4$ electrode of the transfer register and H-level voltage is applied on the transfer gate HSH, the transfer gate potential lowers to $\phi_{HSH}{}^{(H)}$ and a part of the charges in the storage HST are transferred to the transfer register RG (a-4, b-4).

Then at time t5 when L-level voltage is applied on the storage electrodes HST1 and HST2, respective potentials rise to $\phi_{HST1}{}^{(L)}$ and $\phi_{HST2}{}^{(L)}$. Since $\phi_{HST1}{}^{(L)} > \phi_{HST2}{}^{(L)} > \phi_{HSH}{}^{(H)}$, as described before, the remaining charges in the storage HST transfer to the transfer register RG (a-5, b-5). This potential state is kept until the charges in the storage HST completely transfer to the transfer register RG. If this process requires time longer than half of the transfer clock cycle, the clock may be stopped as needed.

After the charges transfer to the transfer register RG, the transfer gate voltage is returned to L-level at time t6 (a-6, b-6). After that, transfer clock pulse signals $\phi_1$ through $\phi_4$ are fed to the transfer register electrodes to output the charges.

Now the reason is explained why the storage electrode is divided into two separate portions HST1 and HST2. The CCD of the present embodiment is required to have higher stability than ordinary image-sensing CCDs because it is used for the spectrophotometer. The stability of photosensors is greatly affected by shot noises in the photoelectric conversion process, and the amount of the shot noises is given by the square-root of the amount of generated electrons. Therefore, the ratio of the number of shot noises to the number of generated electrons $\sqrt{N}/N$ can be reduced by increasing the number of electrons N. If the ratio $\sqrt{N}/N$ is designed to be less than 0.03%, N should be greater than $1.1 \times 10^7$ (or the charge greater than 1.8 pC). Since, in ordinary CCD line sensors, the number N is about $10^6$, the CCD of the present embodiment needs to deal with 10 to 100 times greater amount of electrons. When a surface channel MOS is used as the electron storage as in this embodiment, the capacity depends on the area, dopant concentration and bias voltage (greater area, higher concentration and higher bias voltage yields greater capacity). For the CCD transfer register, however, higher dopant concentration makes the manufacture process difficult because slight deviations in the concentration and depth of the N-well greatly affects the channel potential. As for the bias voltage, it is restricted by the source voltage of the CCD device, and the greater bias voltage leads to a greater dark output from the storage. After all, increase in the area is the realistic solution to the big charge capacity.

Since the width of the storage area is limited by the array pitch of the photodiodes, there is no way but to increase the length. But the elongated storage will need longer read-out time: the charge transfer process through the transfer gate to the transfer register depends on the thermal diffusion of the charges. The time $t_{tr}$ is calculated as $$t_{tr} = 4 \cdot L_{st}^2 / (\pi^2 \cdot D),$$

where $L_{st}$ is the length of the storage and D is the diffusion coefficient. This equation shows that the time $t_{tr}$ increases with the square of the length $L_{st}$.

The present embodiment addresses the problem by dividing the storage into two portions each having the half length $L_{st}/2$ and giving them different potentials. By this structure, the read-out time $t_{tr}'$ halves, as $$t_{tr}' = 4 \cdot (L_{st}/2)^2/(\pi^2 \cdot D) + 4 \cdot (L_{st}/2)^2/(\pi^2 \cdot D) = t_{tr}/2.$$

Then the reason is explained why the voltage applied on the storage is not DC bias voltage but pulse voltage. As described above, greater bias voltage yields greater charge capacity. But, if the potential of the storage is set lower than the potential of transfer gate when the transfer gate is applied H-level voltage, some charges remain in the storage, as shown in FIG. 14(a-4) or 14(b-4). So the potential of the storage should be raised to completely drain the charges to the transfer register. This is why the storage is applied a pulse signal.

A variation is shown in FIG. 16 where the two storages are given different potentials too. In this case, after making the first polysilicon layer, boron ions are doped in the P-substrate 42 using the resist layer and the first polysilicon layer as the mask. By this boron doping, the left storage area 43 with higher dopant concentration has lower potential. In this case, a common terminal HST can be used for the two storage electrodes 43 and 44, because the same voltage automatically produces different potentials in those areas. Further, since the doped area 43 has higher concentration, its capacity is large and the read-out time is reduced.

Another example of the CCD structure is described. When the photodiode is buried, there are two ways to put the $N^-$ layer 39 and the $P^-$ layer 40 as shown in (a) and (b) of FIG. 17. In FIG. 17(a), the upper $P^-$ layer 40 extends beyond the $N^-$ layer 39, while in FIG. 17(b), the $P^+$ layer 40 is buried in the $N^-$ layer 39. In the former design (a), there emerges a potential fence 90 which causes an incomplete charge transfer from the photodiode to the barrier gate. In this case, the charge transfer from the photodiode to the storage is performed by the thermal diffusion process, the charge transfer takes very long time. In the latter design (b), the part of the $N^-$ layer 39 not covered by the $P^-$ layer 40 makes a charge sink 91. It also needs long time to evacuate charges by the thermal diffusion from the charge sink 91, but this time is short compared to the take-out time of the former design (a). For that reason, the present embodiment adopts the latter design (b). Yet, when high-speed response is required to the photosensor (e.g., that for a spectrophotometer using stationary light), the evacuation time is undesirable. The following example of the CCD structure addresses the problem.

Figure 25:
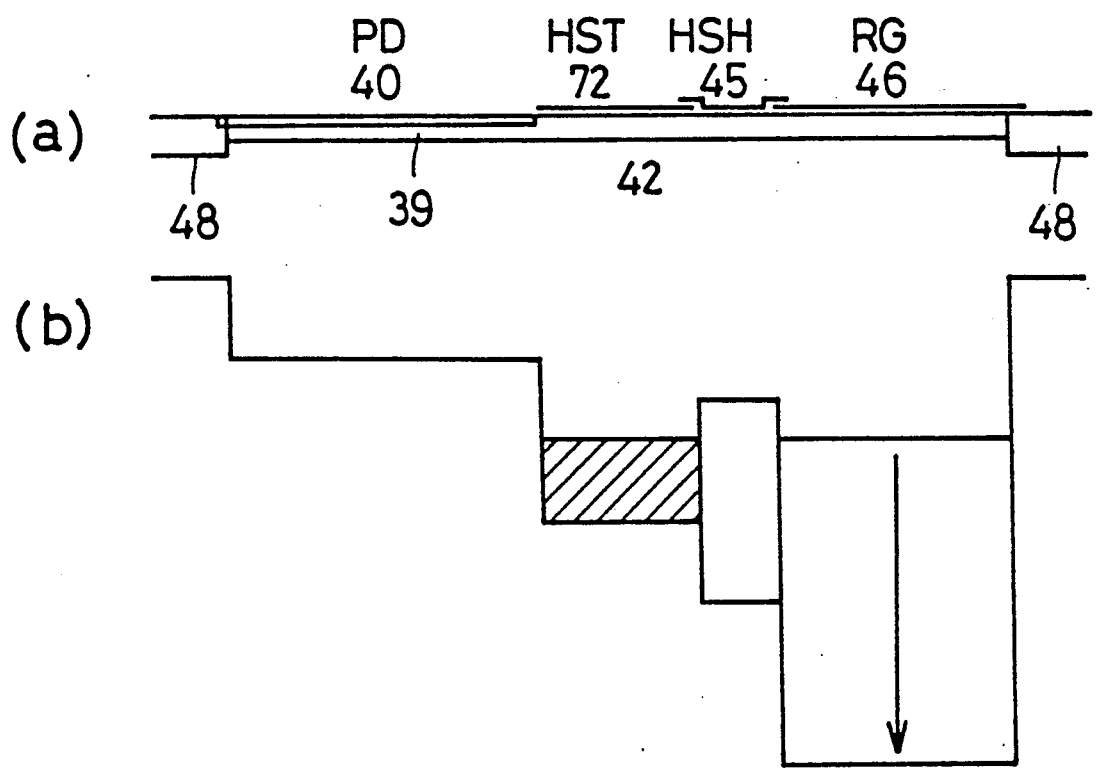

As shown in the plan view of FIG. 23 and the sectional view of FIG. 25 along the line XXV—XXV (which is along the direction of charge transfer to the transfer register), the photodiode PD has the buried structure which is constructed by the N⁻ layer 39 and the P⁺ layer 40 in the P-type substrate 42. The storage HST 72 has the buried channel MOS structure which is constructed by the N⁻ layer 39 on the P-substrate 42 and the first polysilicon electrode on the N⁻ layer 39 via a 100 nm-thick $SiO_2$ insulator. In this example, a DC bias voltage is applied on the storage electrode HST to fix the potential lower than that of the photodiode PD. The transfer gate HSH 45 has a similar structure to that of the storage HST 72 but the electrode is made of the second polysilicon layer which is insulated from the first polysilicon layer. The HSH electrode 45 is applied a pulse voltage: at its H-level, the potential becomes lower than that of the storage HST 72 to enable the charge flow to the transfer register RG 46. The transfer register RG 46 also has a similar structure as the storage HST 72, and the transfer register array transfers charges with the four-phase pulse voltage.

Figure 24:
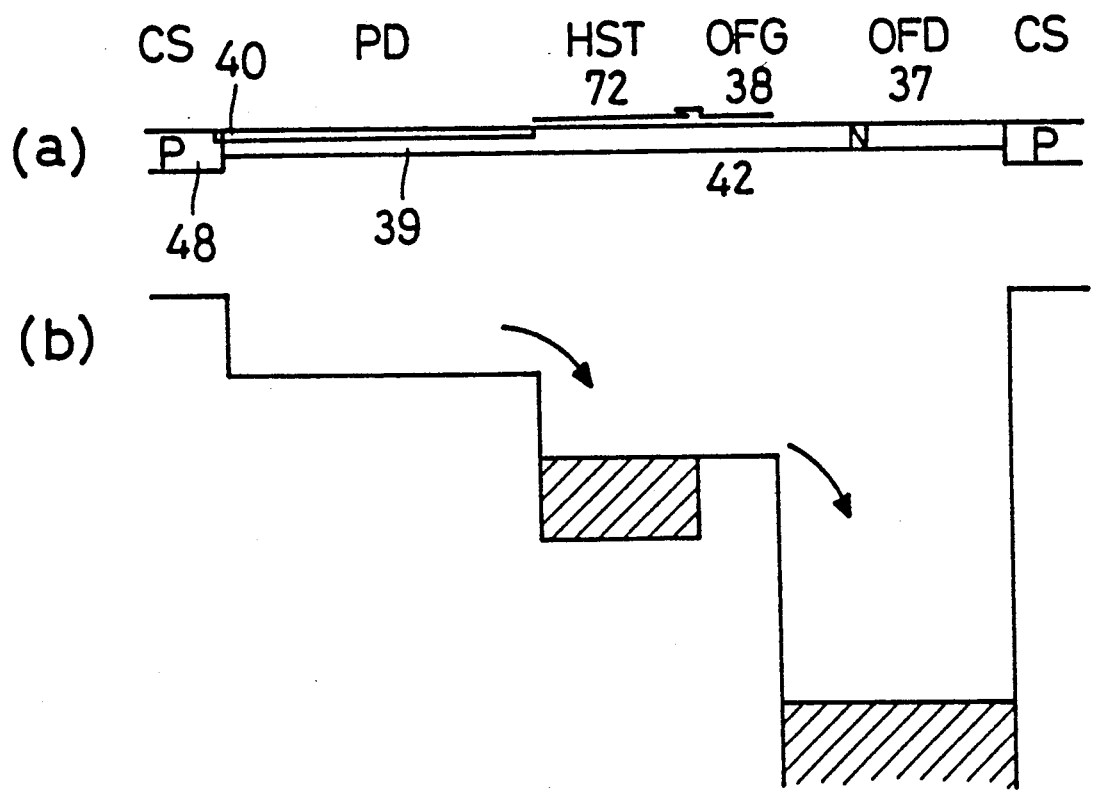

FIG. 24 shows the section along the line XXIV—XXIV (which is along the direction of the charge drainage) of FIG. 23. The overflow drain OFD 37 drains excessive charges produced in the photodiode PD and overflowed from the storage HST 72. The overflow gate OFG 38, whose voltage determines the drainage level, has a similar structure to the storage HST 72 but the electrode is made by the second polysilicon layer. The overflow gate OFG 38 is applied a DC voltage which fixes the overflow gate potential lower than that of the transfer gate HSH at L-level and higher than that of the storage HST. By this potential arrangement, the storage HST stores charges to the overflow gate level, and after reaching the level, they overflow to the overflow drain OFD but not to the transfer register RG. The CS 48 in FIG. 24 is the channel stop.

In the above example, no barrier gate BG is used between the photodiode PD and the storage HST (cf. FIGS. 12 and 13) because it is unnecessary to fix the potential of the photodiode PD with the barrier gate BG since the photodiode PD is completely depleted. Further, the storage HST, the transfer gate HSH and the overflow gate OFG are all buried in the substrate (i.e., the buried channel MOS structure) in the above example in order to eliminate charge sink as shown in FIG. 17(b) by making the whole photosensor (including the photodiode) depleted.

The storage HST is not applied a pulse voltage in the above example because, as the concentration of the N⁻ layer 39 is about 10 times that of the P-substrate, the buried channel MOS structure can deal with greater amount of charges than the surface channel structure per unit area. Therefore there is no need to divide the storage HST as in the previous example, nor complicated bias control (to set the storage potential lower than the transfer gate potential at H-level in storing the charges) is necessary, which reduces burden of the bias control circuit.

(3) Structure of the common transfer registers and their operation

Now the structure and operating method of the transfer registers commonly used by the high-sensitivity photosensors and low-sensitivity photosensors are described. FIG. 18 shows the first example in which: numeral 54 is a storage of the high-sensitivity photosensor, 57 is a storage of the low-sensitivity photosensor, 55 is the transfer gate of the high-sensitivity photosensor, 56 is the transfer gate of the low-sensitivity photosensor, 58 is the channel stop and 59 is the transfer channel of the transfer registers. Numerals 60, 61, 62 and 63 designate the four transfer electrodes (the CCD is driven by a four-phase pulse signal) receiving the four transfer pulse signals $\phi_1$, $\phi_2$, $\phi_3$ and $\phi_4$ respectively. Among the four electrodes, two 60 and 62 are made by the underlying first polysilicon layer (shown by broken line) and are connected to the respective terminal through the contact holes 64. When the transfer pulse $\phi_2$ is at H-level, the charges in the transfer register (which have been produced in a high-sensitivity photosensor) are transferred to the second-neighbor transfer register under the terminal $\phi_4$. To the transfer register under the neighbor $\phi_4$ electrode is transferred charges generated in a low-sensitivity photosensor. Thus, charges generated at the high-sensitivity photosensors are transferred to the transfer registers at even ordinal numbers, charges generated at the low-sensitivity photosensors are transferred to the transfer registers at odd ordinal numbers, and the final transfer register gives forth the output of high-sensitivity photosensors and the output of low-sensitivity photosensors alternately.

The second example of the transfer register is shown in FIG. 19 (same numerals are used for the same elements of FIG. 18) and the operating timing chart is shown in FIG. 20. When the voltage of the transfer register terminal $\phi_4$ is at H-level, charges in the low-sensitivity photosensors are transferred to the transfer registers at even numbers under $\phi_4$ electrodes. When the voltage of the transfer register terminal $\phi_2$ is at H-level, the charges are transferred to the transfer registers at odd numbers under $\phi_2$ electrodes. At this time, the charges in the high-sensitivity photosensors are transferred to the transfer registers at even numbers under $\phi_2$ electrodes. Thus outputs from the high-sensitivity photosensors are transferred to the transfer registers at even numbers, the outputs from the low-sensitivity photosensors are transferred to the transfer registers at odd numbers, and the final transfer register gives forth the output of high-sensitivity photosensors and the output of low-sensitivity photosensors alternately.

Another method of reading out the outputs of the high-sensitivity and low-sensitivity photosensors to the transfer registers is described. In the above example, the both outputs are simultaneously transferred to the transfer registers. But when longer reading-out time is allowed, the following reading out method can be adopted. First the outputs of the high-sensitivity photosensors are transferred to the transfer registers, while the low-sensitivity photosensor outputs are held in the storages, and then after the read-out of the high-sensitivity photosensor outputs is completed, the low-sensitivity photosensor outputs are transferred to the transfer registers. In this case, outputs from the final transfer register come out every two packets, which will be suitable in calculating the transfer inefficiency correction (described later). It should be noted here that outputs from the high-sensitivity photosensors should be read out first because there may be some high-sensitivity photosensor cells that overflow by the dark output during holding.

The transfer register structure as shown in FIG. 22 suits such alternate batch reading out method (same numerals are used for the same elements of FIG. 18). When H-level voltage is applied on the $\phi_2$ electrode 61 and H-level voltage is applied on the transfer gate 55, charges in the high-sensitivity photosensors transfer to the transfer registers. Then when H-level voltage is applied on the $\phi_4$ electrode 63 and H-level voltage is applied on the transfer gate 55, charges in the low-sensitivity photosensors transfer to the transfer registers. As seen in FIG. 22, the array pitch of the photosensors and that of the transfer registers are equal so that higher cell density can be obtained.

(4) Structure of the output terminal of the transfer registers

FIG. 21 shows the output portion of the CCD where the numerals 60, 61, 62 and 63 designate transfer register electrodes, 65 is the output gate, 68 (hatched) is the floating diffusion, and 67 is the reset drain. The reset drain 67 is to reset the voltage of the floating diffusion 68 before new charges come in, and is controlled by the reset gate 66. Numerals 70 and 71 designate source and drain respectively of the output FET. The drain 71 connects to the power source of the CCD, and the source 70 connects to the ground via a resistance or a constant-current source to form a source-follower amplifier. The gate of the FET connects to the floating diffusion 68, and the voltage of the source 70 is the output of the CCD transfer registers. The numeral 69 designates a MOS capacitor made by [channel stop (P+)]/[100 nm-thick $SiO_2$ insulator]/[polysilicon electrode] structure. Since, in the present embodiment, the amount of transferring charges is increased to minimize the influence of the shot noises, the floating diffusion 68 should have a large capacity to yield a sufficient output voltage (1-2 V). But the floating diffusion 68 is made of a PN junction which can not have sufficient capacity per area. Therefore the MOS capacitor 69 is provided in this embodiment to add to the capacity of the floating diffusion 68. Suppose the concentration in the P-substrate 42 is $1 \times 10^{15}$, that in the N layer is $1 \times 10^{20}$ and the bias voltage is 14 V, the capacity per area $C_{PN}$ of the PN junction is about $2.4 \times 10^{-9}$ F/cm$^2$, while that $C_{MOS}$ of the MOS capacitor 69 is about $3.5 \times 10^{-8}$ F/cm$^2$. This means one tenth the area of the floating diffusion 68 is sufficient to obtain the same capacity of the MOS capacitor 69.

Further, since the capacity of a PN junction changes as the depth of the depletion layer changes, the output voltage does not linearly correspond to the amount of transferred charges which is undesirable for use in spectrophotometers. This shortcoming is solved in the present embodiment by making the capacity of the MOS capacitor 69 far greater than that of the PN junction (i.e., floating diffusion 68). In this case, the unchangeable capacity of the MOS capacitor 69 is dominant in the total capacity and the output voltage shows linearity to the amount of transferred charges. The channel stop 58 tapers toward the floating diffusion 68 in order to smoothly lead charges to the floating diffusion 68. The array pitch of the transfer register electrodes increases toward the output terminal in order to keep the capacity under every transfer register terminal constant despite the shrinking channel width.

III Operation of the CCD line sensor and the signal processing (1) Correction of the output for the transfer inefficiency Here a method to correct the output excluding the transfer inefficiency is explained because analog shift registers as used in this embodiment include some transfer inefficiency in transferring charges. Even if the transfer register is as small as $1 \times 10^{-15}$, total transfer inefficiency after 100-step transfer becomes 0.1%, which is unacceptable in spectrophoto-measurements. The correction method we used in this embodiment is as follows.

When the transfer inefficiency by one-step transfer is $\epsilon$ and the size (amount of charges) of an original charge packet is $Q^{(o)}$, the amount of charges remaining in the packet after n-time transfer is $$(1-n\cdot\epsilon)\cdot Q^{(o)}.$$

and the amount of charges that is given to the next packet is $$n\cdot\epsilon\cdot Q^{(o)}.$$

In precise, there are some amount that is given to the two-next packet, but it is of the order of $\epsilon^2$ which is negligible when the transfer inefficiency is about $10^{-5}$.

When the initial charge amount at the i-th register (counted from the output end) is $Q_i^{(o)}$, the j-th output is $Q_j$, and the total number of transfer registers is N, the remaining amount in the i-th packet is $$(1-i\cdot\epsilon)\cdot Q_i^{(o)}.$$

and the amount given to the (i+1)-th packet is $$i\cdot\epsilon\cdot Q_i^{(o)}.$$

This amount is outputted in addition to the original amount of the (i+1)-th packet. In summary, the output amounts are:

$$Q_1 = (1-1\cdot\epsilon)\cdot Q_1^{(o)}.$$

$$Q_2 = (1-2\cdot\epsilon)\cdot Q_2^{(o)} + 1\cdot\epsilon\cdot Q_1^{(o)}.$$

$$Q_3 = (1-3\cdot\epsilon)\cdot Q_3^{(o)} + 2\cdot\epsilon\cdot Q_2^{(o)}. \ldots$$

$$Q_i = (1-i\cdot\epsilon)\cdot Q_i^{(o)} + (i-1)\cdot\epsilon\cdot Q_{i-1}^{(o)}. \ldots$$

$$Q_{N-1} = (1-(N-1)\cdot\epsilon)\cdot Q_{N-1}^{(o)} + (N-2)\cdot\epsilon\cdot Q_{N-2}^{(o)}.$$

and $$Q_N = (1-N\cdot\epsilon)\cdot Q_N^{(o)} + (N-1)\cdot\epsilon\cdot Q_{N-1}^{(o)}.$$

These equations are combined as FIG. 32 to make a vector and matrix equation, and is simply expressed as follows by using an output vector Q, a transformation matrix R, and an original charge amount vector $Q^{(o)}$:

$$Q = R \cdot Q^{(o)}.$$

Therefore the original charge amount $Q^{(o)}$ is calculated by $$Q^{(o)} = R^{-1} \cdot Q.$$

where $R^{-1}$ is the inverse matrix of R. The inverse matrix $R^{-1}$ is calculated by $$R^{-1} = adjR / |R|.$$

where $$|R| = \prod_{i=1}^{N} (1 - i\cdot\epsilon).$$

$$(adjR)_{i,j} = |R|/\{1 - (N - j - 1)\cdot\epsilon\}$$

-continued $(j = 1 \text{ to } N)$ $(adjR)_{j+1,j} = -(N-j)\cdot\epsilon\cdot\{1-(N-j)\cdot\epsilon\}\cdot(adjR)_{i,j}$ $(j = 1 \text{ to } N-1)$ $(adjR)_{i,j} = 0$  (else).

The one-step transfer inefficiency $\epsilon$ should be measured. Since the transfer inefficiency $\epsilon$ depends on the temperature, it should be measured just before the spectrophoto-measurement. The transfer inefficiency $\epsilon$ can be measured by the known method in which charges are input before the transfer registers, and the input and output amounts are compared. In this embodiment where the transfer registers are arranged at half the pitch of photosensors, the following method can be used.

Usually, deviations in the sensitivity among the photosensors are measured using a standard white board before a spectrophoto-measurement. The transfer inefficiency $\epsilon$ can also be measured at this time. When the strobe light flashes, only the low-sensitivity photosensor outputs are read out. As described before, the outputs of the low-sensitivity photosensors come out every two packets. Since there is a transfer loss in the output of the last pixel, the last output is $(1-N\cdot\epsilon)\cdot Q_N^{(o)}$, where $Q_N^{(o)}$ is the original amount of the last pixel. Since the charges are in every two transfer registers, the amount of remainder of the previous packet $Q_{N-1}^{(o)}$ is zero and the remainder of the two-previous packet is of $\epsilon^2$ order which is negligible, the output $Q_N$ of the N-th packet is $$Q_N = (1-N\cdot\epsilon)\cdot Q_N^{(o)}.$$

The remainder (i.e., loss) of the $Q_N^{(o)}$ packet given to the next packet is $N\cdot\epsilon\cdot Q_N^{(o)}$, which is the amount of the (N+1)-th packet.

$$Q_{N+1} = N\cdot\epsilon\cdot Q_N^{(o)}$$

From the last two equations, $$Q_{N+1}/(N\cdot\epsilon) = Q_N/(1-N\cdot\epsilon),$$

$$(1-N\cdot\epsilon)\cdot Q_{N+1} = N\cdot\epsilon\cdot Q_N,$$

or $$Q_{N+1} = N\cdot\epsilon\cdot(Q_N Q_{N+1}).$$

This gives the transfer inefficiency $\epsilon$ as $$\epsilon = \{Q_{N+1}/(Q_N+Q_{N+1})\}/N.$$

The correction of the outputs is thus enabled using this transfer inefficiency $\epsilon$.

When the high-sensitivity photosensor outputs and low-sensitivity photosensor outputs are separately read out as described before, the following correction calculation is used. This method is effective where the array pitch of the transfer registers is half that of the pixel array, and the principle is the same as the above described $\epsilon$-calculating method: the original packet size at every two packet is zero. The output of a significant packet does not include a remainder of the previous packet, but it leaves a transfer loss to the next packet which was originally vacant. Thus the output $Q_i$ of i-th significant packet (whose original size was $Q_i^{(o)}$) is $$Q_i = (1-i\cdot\epsilon)\cdot Q_i^{(o)},$$

and the next output $Q_{2+1}$ is $$Q_{i+1} = i\cdot\epsilon\cdot Q_i^{(o)}.$$

By adding these two outputs $Q_i$ and $Q_{i-1}$, the original charge amount (packet size) $Q_i^{(o)}$ is obtained, as $$Q_i^{(o)} = Q_i + Q_{i+1}.$$

This addition can be calculated in the microcomputer 12.

Alternatively, the addition can be performed by the hardware. At time t1 of the timing chart of FIG. 30, there are charges 73 in the charge packet proximate to the output terminal and their remainder (transfer loss) 74 in the following packet, as shown in FIG. 31. At subsequent times t2 and t3, the packets come closer to the output. At time t4, H-level voltage is applied on the reset gate RG and the potential of the floating diffusion FD is reset at the level of the reset drain RD. After the reset gate RG shuts at time t5, the charges in the packet 73 flow into the floating diffusion FD at times t6 and t7 and the potential there lowers by the amount denoted by 75. This state is maintained at times t8 and t9 when the following packet 74 approaches the output, and the remainder charges in the packet 74 adds to the floating diffusion FD at time t11 to lower the potential by the amount denoted by 76. After all, the potential of the floating diffusion FD lowers by the amount denoted by 77 which is the total of the two packets 73 and 74, and this total is read out as an output. Thus, by simply doubling the cycle time of the reset gate pulses as that of the transfer pulses, the transfer inefficiency is compensated for.

(2) Spectrophoto-measurement

Now the process of the spectrophoto-measurement according to the present embodiment is described referring to the flowcharts of FIGS. 26, 27 and 28. The general flow is shown in FIG. 26 where first residual charges are drained at step #1. Charges in the photosensors and transfer registers of the CCD are drained to initialize because the buried channel of the transfer registers is not vacant after the power to the CCD is turned on. The initialization of the transfer registers is done by applying transfer drive pulses on them. Initial charges due to dark output of the photodiodes in the photosensors are also transferred through the transfer registers to drain.

After the initialization, the strobe light is flashed at step #2, and charges corresponding to the filtered and spectrum-decomposed light are generated at the photodiodes. Step #3 is to select either of photodiodes of the CCD-A or CCD-B (FIG. 4(a)) that is effective. This step #3 is detailed by the flowchart of FIG. 27.

First in this routine, the loop index I is initialized to 1 at step #101, and it is determined at step #102 which of the i-th pixels in the CCD-A and CCD-B is effective. As described before, the four segments 3-a through 3-d of the bandpass filter 6 are separately arranged on the two CCD arrays CCD-A and CCD-B, and either one of the outputs of the two pixels at the same X position is invalid because it includes components corresponding to the unnecessary transmission band. This selection is executed based on the information previously stored in the E²PROM in the microcomputer 12. If the output of a pixel in the CCD-A is determined effective at step #102, the CPU of the microcomputer 12 sends a select signal SELECT-A to the multiplexer 9 to choose the output OSA of the pixel in the CCD-A as the output OS of the CCD at step #103. If the pixel in CCD-B is determined effective, select signal SELECT-B is sent to the multiplexer 9 to choose the output OSB of the pixel in the CCD-B as the output OS of the CCD at step #104. The selected output OS is sent to the A/D converter 11 via the analog signal processor 10 to be A-D converted. At step #105, the A-D converted signal is read by the microcomputer 12. Then it is determined at step #106 whether this data is final (i.e., whether the loop index I equals the effective number of pixels N), and if so the routine ends. If I<N, the index I is incremented by 1 at step #107 and the steps #102-#106 are repeated to read out all outputs from the N pixels. When the high-sensitivity photosensor outputs and low-sensitivity photosensor outputs are separately read out, this process is repeated twice.

After reading out outputs of all pixels at step #3 of FIG. 26, outputs are read out while the strobe light does not flash (dark outputs) at step #4 to compensate for the previously read-out data. Then the correction calculations as described above are performed at step #5 to obtain the originally generated charge amount from the outputs affected by the transfer inefficiency $\epsilon$. This correction calculations are performed for both the normal outputs and the dark outputs, and the corrected normal outputs are subtracted by the corrected dark outputs at step #6 to obtain the data truly corresponding to the input light intensities. Finally at step #7, one of the high-sensitivity photosensor output and the low-sensitivity photosensor output is chosen and is normalized. This step #7 is detailed by the flowchart of FIG. 28.

At first of the flow of FIG. 28, the loop index I is initialized to 1 at step #201, and then the high-sensitivity photosensor output $V_H(I)$ is compared at step #202 with the saturated output $V_{sat}$ which is previously stored in the E²PROM. If $V_H(I) < V_{sat}$, the high-sensitivity photosensor output $V_H(I)$ is preferred to the low-sensitivity photosensor output $V_L(I)$ of the same pixel, and is normalized by dividing by the sensitivity $R_H(I)$ of the high-sensitivity photosensor at step #204 to make the final intensity data D(I) of the I-th pixel.

After choosing the final data D(I), the index I is compared with the number N of pixels to check whether all the final data D(I) have been determined. If I<N, then the index I is incremented by 1 at step #205 and the steps #202 through #205 are repeated until I=N. When all the final data D(1) through D(N) are determined, this routine ends.

Suppose here that light of the region II-b of FIG. 10(b) enters the i-th pixel, that of region II-c enters in (i+1)-th pixel and that of region II-a enters in (i+2)-th pixel. When I=i in the flow of FIG. 28, low-sensitivity photosensor output $V_L(i)$ is also lower than the saturated level $V_{sat}$ (and higher than the dark level $V_{dark}$), but the higher output $V_H(i)$ is preferred (note that always $V_H(I) \geq V_L(I)$) because it is less vulnerable to various noises. When I=i+1, since $V_H(i+1)=V_{sat}$, the low-sensitivity photosensor output $V_L(i+1)$ is chosen and normalized to make the final data D(i+1) at step #203. Thus the effective measurement data can be obtained for any light amount falling in the regions II-a, II-b and II-c of FIG. 10(b), spectrophotometer having very wide dynamic range can be constructed by using the CCD of the present embodiment.

The sensitivities $R_H(I)$ and $R_L(I)$ of the photosensors that are used to normalize the output data at steps #203 and #204 are obtained as follows. In the memory of the microcomputer 12 are stored sensitivities $R_H(I)^{(o)}$ and $R_L(I)^{(o)}$ at a reference temperature $T_o$ and temperature coefficients $k_i$ of the sensitivities. Before the photomeasurement, the CPU of the microcomputer 12 sends a select signal SELECT-T to the multiplexer 9 to select the signal TMP from the temperature sensor 8-c of the chip 7. Using the temperature data T and the stored data, the sensitivities $R_H(I)$ and $R_L(I)$ are calculated by $$R_H(I) = R_H(I)^{(o)} + k_t(T - T_o),$$

and $$R_L(I) = R_L(I)^{(o)} + k_t(T - T_o).$$

In the above description of the specific embodiment, the CCD line sensor is an N-channel type where electrons are transferred. But it is apparently possible to use P-channel type instead under the present invention. Similarly, the two-polysilicon-layer structure or the four-phase transfer driving is only an example specified for comprehension, and those skilled in the art can employ other structures without departing from the spirit of the present invention. The spectrofilter 1 may be replaced by a grating type. Though the transfer register array is commonly used by the high-sensitivity and low-sensitivity photosensor arrays in the above embodiment, each photosensor array can have its own transfer register array.

What is claimed is:

1. A photometer comprising:
   two photosensor arrays, each array including a plurality of photoelectric sensors generating an amount of electrical charges corresponding to an incident light amount, and photoelectric sensors of an array having a sensitivity range that is different from and overlapping with that of the photoelectric sensors of the other array; and
   a transfer register placed between the two photosensor arrays, each stage of the transfer register receiving the electrical charges that are generated in one of the photoelectric sensors of the two photosensor arrays, and the transfer register array transferring the electrical charges to an output terminal of the photometer.

2. A photometer comprising:
   first and second photosensor arrays, each array including N photoelectric sensors, each for generating an amount of electrical charges corresponding to an incident light amount, and photoelectric sensors of an array having a sensitivity range that is different from that of the photoelectric sensors of the other array;
   a transfer register including an array of 2 N stages, each alternate one of the stages receiving the electrical charges that are generated in each of the photoelectric sensors of an alternate one of the two photosensor arrays, and the transfer register transferring the electrical charges to an output terminal of the photometer;
   a transfer controller for applying a transfer clock signal on every stage of the transfer register, and first and second transfer-gate arrays, each array placed between the transfer register array and a respective one of the first and second photosensor arrays and including N transfer gates, each for controlling transfer of the charges from each of the photosensors and each of the transfer registers, both first and second transfer-gate arrays being applied with the same phase of the transfer clock signal.

3. A photometer, as in claim 2, where the charges generated in all of the photosensors are transferred to corresponding stages of the transfer register at one time.

4. A photosensor, as in claim 2, where the charges generated in photosensors of the first photosensor array are transferred to corresponding stages of the transfer register at one time, and the charges generated in photosensors of the second photosensor array are transferred to corresponding transfer registers at another time.

5. A photometer comprising:

first and second photosensor arrays, each array including N photoelectric sensors, each for generating an amount of electrical charges corresponding to an incident light amount, and photoelectric sensors of an array having a sensitivity range that is different from that of the photoelectric sensors of the other array;

a transfer register including 2 N stages, each alternate one of the stages receiving the electrical charges that are generated in each of the photoelectric sensors of an alternate one of the two photosensor arrays, and the transfer register transferring the electrical charges to an output terminal of the photometer;

a transfer controller for applying a transfer clock signal on every stage of the transfer register, and first and second transfer-gate arrays, each array placed between the transfer register array and a respective one of the first and second photosensor arrays and including N transfer gates, each for controlling transfer of the charges from each of the photosensors and each of the transfer registers, the first and second transfer-gate arrays being applied with different phases of the transfer clock signal.

6. A photometer, as in claim 5, where the charges generated in photosensors of the first photosensor array are transferred to corresponding stages of the transfer register at one time, and the charges generated in photosensors of the second photosensor array are transferred to corresponding stages of the transfer register at another time.

7. A photometer, as in claim 5, where the charges generated in photosensors of the first photosensor array are transferred to corresponding stages of the transfer register at one time, then the charges transferred to said stages are further transferred to stages that are applied to the same phase of the transfer clock signal but are disconnected from the transfer gates of the second transfer-gate array, and then the charges generated in photosensors of the second photosensor array are transferred to corresponding stages of the transfer register.

8. A photometer, as in claim 5, where the charges generated in photosensors of the first photosensor array are transferred to corresponding stages of the transfer register first, then the charges transferred to the stages are further transferred through the transfer-register array to the output terminal, then the charges generated in photosensors of the second photosensor array are transferred to corresponding stages of the transfer register, and then the charges transferred to the stages are further transferred through the transfer register to the output terminal.

9. A photometer comprising:

two photosensor arrays, each array including a plurality of photoelectric sensors generating a signal corresponding to an incident light amount, and photoelectric sensors of an array having a sensitivity range that is different from that of the photoelectric sensors of the other array; and a transfer resister having two groups of stages, one group receiving the signals from one photosensor array, the other group receiving the signals from the other photosensor array, and the transfer resistor transferring the signals to an output terminal of the photometer.

* * * * *